US012754485B2

(12) United States Patent
Jahani et al.

(10) Patent No.: US 12,754,485 B2
(45) Date of Patent: Oct. 6, 2026

(54) INTEGRATED OPTICAL SYSTEM FOR SCALABLE AND ACCURATE INSPECTION SYSTEMS

(71) Applicant: ASML Netherlands B.V., Veldhoven (NL)

(72) Inventors: Saman Jahani, Stamford, CT (US); Roxana Rezvani Naraghi, Easton, CT (US); Stephen Roux, New Fairfield, CT (US); Justin Lloyd Kreuzer, Trumbull, CT (US); Jorn Paul Van Engelen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 32 days.

(21) Appl. No.: 18/868,798

(22) PCT Filed: Jun. 7, 2023

(86) PCT No.: PCT/EP2023/065185
§ 371 (c)(1),
(2) Date: Nov. 25, 2024

(87) PCT Pub. No.: WO2023/242012
PCT Pub. Date: Dec. 21, 2023

(65) Prior Publication Data
US 2026/0194828 A1 Jul. 9, 2026

Related U.S. Application Data

(60) Provisional application No. 63/352,037, filed on Jun. 14, 2022.

(51) Int. Cl.
*G03F 7/00* (2006.01)

(52) U.S. Cl.
CPC .... *G03F 7/706851* (2023.05); *G03F 7/70641* (2013.01); *G03F 7/706837* (2023.05); *G03F 7/706845* (2023.05)

(58) Field of Classification Search
CPC ........... G03F 7/706849; G03F 7/70641; G03F 7/706837; G03F 7/706845;
(Continued)

(56) References Cited

U.S. PATENT DOCUMENTS 5,623,561 A * 4/1997 Hartman ............ G01N 21/7703 385/12
6,297,876 B1 10/2001 Bornebroek
(Continued)

FOREIGN PATENT DOCUMENTS

CN 112198589 A 1/2021
JP H05-217838 A 8/1993
(Continued)

OTHER PUBLICATIONS

English translation of JPH05-217838 (Year: 1993).*
(Continued)

*Primary Examiner* — Christina A Riddle
(74) *Attorney, Agent, or Firm* — Pillsbury Winthrop Shaw Pittman, LLP

(57) ABSTRACT

An inspection system includes a radiation source, an integrated optical system, and first and second detectors. The radiation source generates radiation to irradiate a target. The integrated optical system includes: a substrate; first, second, third, and fourth waveguides; first and second grating couplers; a first combiner coupled to the first and second waveguides; and a second combiner coupled to the third and fourth waveguides. The first grating coupler couples first and third portions of radiation scattered by the target respectively into the first and third waveguides. The second grating
(Continued)

coupler couples second and fourth portions of radiation scattered by the target respectively into the second and fourth waveguides. The first combiner can combine the first and second portions of radiation. The second combiner can combine the third and fourth portions of radiation. The first and second detectors generate measurement signals based on the corresponding combined portions of radiation.

15 Claims, 13 Drawing Sheets

(58) Field of Classification Search
CPC ........... G03F 7/706851; G03F 7/70616; G03F 7/70633; G03F 9/7092; G03F 7/70483–70541; G03F 7/70605–706851; G03F 9/7026; G03F 9/7088; G03F 7/708; G03F 7/70808; G03F 7/70825; G03F 7/70833; G03F 7/7085; G03F 7/7095; G03F 7/70958; G03F 7/70975; G02B 9/0205; G02B 6/124; G02B 6/29325; G02B 6/34; G01N 21/9501; G01N 33/00; G01N 33/6489; G01N 1/32; G01N 21/95607; G01N 23/2251; G01N 21/01; G01N 2201/06113; G01N 2291/028; G01N 2021/8848; G01N 21/47; G01N 21/3595; G01N 21/17; G01N 2021/8877; G01N 29/04; G01N 2021/3568; G01N 27/4166; G01N 2021/8864; G01N 21/88; G01N 2291/018; G01N 29/09; G01N 33/0031; G01N 21/255; G01N 2291/044; G01N 15/0211; G01N 2021/646; G01N 22/00; G01N 23/225; G01N 33/0013; G01N 33/0062; G01N 2001/386; G01N 21/25; G01N 21/3504; G01N 21/552; G01N 21/73; G01N 2291/011; G01N 24/08; G01N 24/7206; G01N 1/02; G01N 13/02; G01N 2013/0208; G01N 2021/392; G01N 2021/95615; G01N 21/5907; G01N 21/78; G01N 21/9515; G01N 21/0683; G01N 5/04; G01N 1/44; G01N 2021/6421; G01N 2021/8822; G01N 21/62; G01N 21/66; G01N 21/91; G01N 2203/0676; G01N 2223/1016; G01N 2223/306; G01N 23/2055; G01N 23/96; G01N 33/54313; G01N 33/54386; G01N 15/0205; G01N 2001/002; G01N 2021/8845; G01N 2201/0636; G01N 23/046; G01N 27/07; G01N 27/48; G01N 13/00; G01N 15/1434; G01N 2013/0241; G01N 2021/558; G01N 2021/9511; G01N 2021/95676; G01N 2021/636; G01N 21/6456; G01N 2201/0639; G01N 2201/0032; G01N 2201/053; G01N 2223/081; G01N 2223/611; G01N 27/27; G01N 27/406; G01N 27/60; G01N 29/36; G01N 30/88; G01N 30/00584; G01N 1/18; G01N 11/02; G01N 2001/1445; G01N 2001/2873; G01N 2021/1706; G01N 2021/4792; G01N 2021/7776; G01N 2021/8874; G01N 2030/8809; G01N 21/658; G01N 2223/316; G01N 2291/02854; G01N 27/414; G01N 21/8806; G01N 21/8851; G01N 21/956; G01N 21/8422; G01N 21/6489; G01N 33/0095; G01N 21/94; G01N 2223/6116; G01N 21/274; G01N 1/14; G01N 21/95; G01N 2021/8411; G01N 21/00; G01N 27/62; G01N 29/2418; G01N 21/55; G01N 21/9505; G01N 21/41; G01N 2021/8887; G01N 33/0036; G01N 1/28; G01N 21/33; G01N 21/39; G01N 21/85; G01N 21/84; G01N 2021/3595; G01N 21/211; G01N 21/3586; G01N 21/3563; G01N 21/3581; G01N 2021/1721; G01N 2021/218; G01N 21/1717; G01N 21/59; G01N 2021/8461; G01N 2021/8578; G01N 21/1702; G01N 21/31; G01N 21/93; G01N 2291/014; G01N 23/2273; G01N 27/30; G01N 29/12; G01N 29/34; G01N 31/00; G01N 2021/88; G01N 2030/025; G01N 2201/126; G01N 2201/127; G01N 23/201; G01N 29/44; G01N 2015/1452; G01N 2021/0112; G01N 2021/8854; G01N 21/63; G01N 2291/2697; G01N 23/203; G01N 23/255; G01N 27/333; G01N 33/0004; G01N 33/0024; G01N 33/0029; G01N 33/0063; G01N 33/0065; G01N 2021/8427; G01N 2030/027; G01N 21/3103; G01N 21/35; G01N 21/554; G01N 21/68; G01N 2201/061; G01N 2201/12; G01N 2291/0423; G01N 2291/0426; G01N 27/623; G01N 30/06; G01N 30/7206; G01N 30/7233; G01N 33/2028; G01N 33/442; G01N 1/10; G01N 1/20; G01N 1/286; G01N 15/1433; G01N 2001/028; G01N 2015/0238; G01N 2021/213; G01N 2021/634; G01N 2021/8809; G01N 21/45; G01N 21/4738; G01N 21/643; G01N 21/65; G01N 2201/0221; G01N 2201/0683; G01N 2201/10; G01N 2223/303; G01N 25/72; G01N 1/24; G01N 1/2813; G01N 1/34; G01N 15/5919; G01N 2021/6491; G01N 2021/845; G01N 2021/9513; G01N 21/031; G01N 21/64; G01N 21/6458; G01N 21/95692; G01N 2201/1296; G01N 2223/054; G01N 2223/085; G01N 2223/304; G01N 2223/305; G01N 2223/645; G01N 2291/0289; G01N 27/626; G01N 3/04; G01N 30/96; G01N 33/54326; G01N 33/553; G01N 33/6803; G01N 1/40; G01N 15/06; G01N 15/0606; G01N 2001/1418; G01N 2021/8477; G01N 2030/8872; G01N 21/9503; G01N 2223/419; G01N 2223/646; G01N 23/2202; G01N 27/002; G01N 27/24; G01N 27/26; G01N 29/14; G01N 29/223; G01N 3/08; G01N 15/0656; G01N 15/075; G01N 19/08; G01N 2001/005; G01N 2021/4186; G01N 2021/473; G01N 2021/637; G01N 2021/8835; G01N 2021/9518; G01N 2035/00346; G01N 21/21; G01N 21/636; G01N 21/8803; G01N 21/958; G01N 2203/0019; G01N 2203/0032; G01N 2203/0091; G01N 2203/04; G01N 2223/05; G01N 2223/418; G01N 2223/6462; G01N 27/20; G01N 27/221; G01N 27/301; G01N 27/3335; G01N 29/041; G01N 29/2431; G01N 3/16; G01N 30/02; G01N 30/72; G01N 33/54387; G01N 35/00; G01N 35/00584; G01N 35/1011; G01N 9/00; G01N 1/04; G01N 1/2214; G01N 1/38; G01N 11/00; G01N 15/08; G01N 2001/1031; G01N 2001/205; G01N 2001/2064; G01N 2015/0046; G01N 2015/086; G01N 2021/4735; G01N 2021/5961; G01N 2021/6417; G01N 2021/8557; G01N 2021/8883; G01N 2021/8896; G01N 2035/0465; G01N 21/272; G01N 2201/13; G01N 2223/315; G01N 2223/61; G01N 2223/633; G01N 2291/048; G01N 2291/052; G01N 2291/103; G01N 23/20; G01N 25/18; G01N 27/02; G01N 27/68; G01N 29/043; G01N 29/24; G01N 29/2406; G01N 29/2412; G01N 29/2437; G01N 29/265; G01N 29/42; G01N 29/4436; G01N 29/46; G01N 31/22; G01N 33/0027; G01N 33/0075; G01N 35/00732; G01N 35/04; G01N 35/085; G01N 5/045; G01N 2223/053; H01L 22/10; H10P 74/20; H10P 72/06; H10P 72/0606; H10P 72/0402; H10P 72/283; H10P 72/3302; H10P 72/53; H10P 72/00; H10P 72/0406; H10P 72/0618; H10P 72/3402; H10P 74/00; H10P 72/78; H10P 72/0424; H10P 72/0414; H10P 72/3221; H10P 72/7416; H10P 76/00; H10P 72/3222; H10P 14/3426; H10P 70/20; H10P 14/24; H10P 14/00; H10P 70/23; H10P 72/0468; H10P 72/3411; H10P 74/273; H10P 14/60; H10P 14/125; H10P 72/0426; H10P 72/0454; H10P 72/32; H10P 72/7428; H10P 90/123; H10P 14/6534; H10P 50/73; H10P 50/0416; H10P 72/0462; H10P 72/0614; H10P 72/3202; H10P 74/232; H10P 74/12; H10P 14/46; H10P 14/6504; H10P 72/0421; H10P 72/744; H10P 72/265; H10P 14/2905; H10P 14/3454; H10P 14/3808; H10P 14/382; H10P 14/61; H10P 14/6939; H10P 50/268; H10P 50/692; H10P 50/695; H10P 70/12; H10P 70/0438; H10P 72/12; H10P 72/14; H10P 72/3304; H10P 72/3306; H10P 72/34; H10P 72/3412; H10P 72/7408; H10P 72/7412; H10P 72/7414; H10P 72/7436; H10P 72/7448; H10P 72/7606; H10P 72/7608; H10P 72/7614; H10P 72/7616; H10P 72/7621; H10P 76/40; H10P 76/405; H10P 90/1914; H10P 90/1916; H10P 95/11; H10P 30/206; H10P 30/208; H10P 30/21; H10P 72/04; H10P 72/0434; H10P 72/0446; H10P 72/1918; H10P 72/3212; H10P 72/7442; H10P 76/20; H10P 90/129; H10P 74/23; H10P 74/203; H10P 74/27; H10P 72/0604; H10P 72/0612; H10P 72/0616; H10P 72/0428; H10P 74/238; H10P 70/15; H10P 54/00; H10P 50/283; H10P 72/7618; H10P 74/207; H10P 95/00; H10P 72/0436; H10P 72/0448; H10P 72/74; H10P 52/00; H10P 74/277; H10P 50/642; H10P 72/50; H10P 72/0431; H10P 72/0456; H10P 72/3408; H10P 74/235; H10P 72/0422; H10P 72/0458; H10P 72/70; H10P 72/7402; H10P 14/6339; H10P 72/0411; H10P 72/3404; H10P 72/7602; H10P 14/3434; H10P 14/6329; H10P 72/10; H10P 90/12; H10P 14/22; H10P 14/6334; H10P 14/6508; H10P 50/00; H10P 72/0404; H10P 72/0611; H10P 72/16; H10P 76/2041; H10P 10/128; H10P 30/204; H10P 50/667; H10P 70/125; H10P 72/0451; H10P 72/0452; H10P 72/0464; H10P 72/1924; H10P 72/3218; H10P 72/57; H10P 72/72; H10P 72/7434; H10P 72/7624; H10P 14/6336; H10P 14/6342; H10P 14/6938; H10P 50/242; H10P 52/402; H10P 70/10; H10P 72/0416; H10P 72/0478; H10P 72/0608; H10P 72/1926; H10P 72/30; H10P 72/3604; H10P 72/7422; H10P 72/7424; H10P 76/4085; H10P 90/00; H10P 10/12; H10P 14/6309; H10P 14/6322; H10P 14/69215; H10P 72/0408; H10P 72/0432; H10P 72/0442; H10P 72/7612; H10P 76/204; H10P 14/265; H10P 14/2922; H10P 14/3238; H10P 14/3456; H10P 14/38; H10P 14/416; H10P 14/432; H10P 14/6346; H10P 14/668; H10P 14/69433; H10P 34/00; H10P 36/00; H10P 50/28; H10P 50/691; H10P 50/71; H10P 70/00; H10P 70/80; H10P 72/0418; H10P 72/0438; H10P 72/0461; H10P 72/0466; H10P 72/0474

USPC .... 356/399–401; 355/18, 30, 44, 46, 52–55, 355/66–77

See application file for complete search history.

(56) References Cited

U.S. PATENT DOCUMENTS

| | | | | |
|---|---|---|---|---|
| 6,961,116 | B2 | 11/2005 | Den Boef et al. | |
| 7,511,799 | B2 | 3/2009 | Tel et al. | |
| 8,289,516 | B2 | 10/2012 | Hofmans et al. | |
| 8,706,442 | B2 | 4/2014 | Mos et al. | |
| 2004/0232316 | A1 | 11/2004 | Abe | |
| 2009/0195768 | A1 | 8/2009 | Bijnen et al. | |
| 2014/0183345 | A1* | 7/2014 | Goodwin ................. | G01D 5/34 250/231.1 |
| 2019/0049863 | A1 | 2/2019 | Shibazaki | |
| 2019/0257640 | A1 | 8/2019 | Avci | |

FOREIGN PATENT DOCUMENTS

| | | | |
|---|---|---|---|
| JP | H08-320219 | A | 12/1996 |
| WO | WO 2021/058571 | A1 | 4/2021 |

OTHER PUBLICATIONS

English translation of CN112198589 (Year: 2021).*

International Search Report and Written Opinion of the International Searching Authority directed to International Patent Application No. PCT/EP2023/065185, mailed Sep. 6, 2023; 9 pages.

International Preliminary Report on Patentability directed to International Patent Application No. PCT/EP2023/065185, issued Dec. 10, 2024; 6 pages.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

(56) References Cited

OTHER PUBLICATIONS

Piggott et al., “Inverse design and implementation of a wavelength demultiplexing grating coupler,” Scientific Reports, vol. 4, No. 7210, Nov. 27, 2014; pp. 1-5.
Raymond et al., “Multiparameter grating metrology using optical scatterometry,” Journal of Vacuum Science & Technology B, vol. 15, No. 2, Mar. 1, 1997; pp. 361-368.
Truffert et al., “Novel monitoring of EUV litho cluster for manufacturing insertion,” Proc. SPIE, vol. 11323, Extreme Ultraviolet (EUV) Lithography XI, Mar. 23, 2020; 14 pages.
Van Laere et al., “Focusing Polarization Diversity Grating Couplers in Silicon-on-Insulator,” Journal of Lightwave Technology, vol. 27, No. 5, Mar. 1, 2009; pp. 612-618.
“Configurable Printed Optical Routing for Parallel Optical Detection,” Research Disclosure No. 698020, May 3, 2022; 36 pages.

* cited by examiner

INTEGRATED OPTICAL SYSTEM FOR SCALABLE AND ACCURATE INSPECTION SYSTEMS

CROSS-REFERENCE TO RELATED APPLICATIONS

This application claims priority of U.S. application 63/352,037 which was filed on 14 Jun. 2022, and which is incorporated herein in its entirety by reference.

FIELD

The present disclosure relates to metrology apparatuses, for example, an alignment sensors used for measuring positions of targets in lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which can be a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (photoresist or simply "resist") provided on the substrate. In general, a single substrate will contain a network of adjacent target portions that are successively patterned. Known lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps can entail different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus can use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, alignment positions of one or more alignment marks can be measured. A lithographic system can output only a finite number of fabricated devices in a given timeframe due to a number of limitations—for example, speed of alignment measurement. While it is possible to implement multiple inspection sensors in parallel inside a lithographic apparatus to speed up inspection of multiple targets, conventional sensors used in lithographic metrology can be large and costly due to their bulk optics, hindering their scalability. Furthermore, optical measurements can be inaccurate due to characteristics of the target being measured, such as tilt, height level, layer stack profile, or the like.

SUMMARY

Accordingly, it is desirable to improve fabrication throughput and accuracy. For example, aspects of optical system described herein can be used to construct scalable and accurate inspection systems.

In some aspects, an inspection system comprises a radiation source, an integrated optical system, and first and second detectors. The radiation source can generate radiation to irradiate a target. The integrated optical system can comprise: a substrate; first, second, third, and fourth waveguides disposed on the substrate; first and second grating couplers disposed on the substrate; a first combiner coupled to the first and second waveguides; and a second combiner coupled to the third and fourth waveguides. The first and second combiners are disposed on the substrate. The first grating coupler can couple first and third portions of radiation scattered by the target respectively into the first and third waveguides. The second grating coupler can couple second and fourth portions of radiation scattered by the target respectively into the second and fourth waveguides. The first combiner can combine the first and second portions of radiation. The second combiner can combine the third and fourth portions of radiation. The first detector can receive the combined first and second portions of radiation from the first combiner and can generate a first measurement signal based on the combined first and second portions of radiation. The second detector can receive the combined third and fourth portions of radiation from the second combiner and can generate a second measurement signal based on the combined third and fourth portions of radiation.

In some aspects, a lithographic apparatus comprises an illumination system, a projection system, and an inspection system. The illumination system can illuminate a pattern of a patterning device. The projection system can project an image of the pattern onto a wafer. The inspection system comprises a radiation source, an integrated optical system, and first and second detectors. The radiation source can generate radiation to irradiate a target. The integrated optical system can comprise: a substrate; first, second, third, and fourth waveguides disposed on the substrate; first and second grating couplers disposed on the substrate; a first combiner coupled to the first and second waveguides; and a second combiner coupled to the third and fourth waveguides. The first and second combiners are disposed on the substrate. The first grating coupler can couple first and third portions of radiation scattered by the target respectively into the first and third waveguides. The second grating coupler can couple second and fourth portions of radiation scattered by the target respectively into the second and fourth waveguides. The first combiner can combine the first and second portions of radiation. The second combiner can combine the third and fourth portions of radiation. The first detector can receive the combined first and second portions of radiation from the first combiner and can generate a first measurement signal based on the combined first and second portions of radiation. The second detector can receive the combined third and fourth portions of radiation from the second combiner and can generate a second measurement signal based on the combined third and fourth portions of radiation.

In some aspects, a method comprises generating radiation to irradiate a target. The method further comprises receiving first and third portions of radiation scattered by the target at first and third locations, respectively, of a first grating coupler. Phase delays of the first and third portions of radiation are based on incidences at the first and third locations, respectively. The method further comprises receiving second and fourth portions of radiation scattered by the target at second and fourth locations, respectively, of a second grating coupler. Phase delays of the second and fourth portions of radiation are based on incidences at the second and fourth locations, respectively. The method further comprises generating a first measurement signal comprising information of the phase delays of the first and second portions of radiation based on the combination of the first and second portions of radiation. The method further comprises combining the third and fourth portions of radiation. The method further comprises generating a second measurement signal comprising information of the phase delays of the third and fourth portions of radiation based on the combination of the third and fourth portions of radiation. The method further comprises determining a position of the target based on analyzing information of the phase delays of the first and second portions of radiation. The method further comprises determining a correction value for the position based on analyzing the information of the phase delays of the third and fourth portions of radiation.

In some aspects, an inspection system comprises a radiation source, an integrated optical system, first and second detectors, and a processor. The radiation source generates radiation to irradiate a target. The integrated optical system comprises a substrate, a waveguide system, and first and second grating couplers. The waveguide system and the first and second grating couplers are disposed on the substrate. The first grating coupler is receives first and third portions of radiation scattered by the target at first and third locations, respectively, of the first grating coupler. The first grating coupler couples the first and third portions of radiation into the waveguide system. Phase delays of the first and third portions of radiation are based on incidences at the first and third locations, respectively. The second grating coupler is receives second and fourth portions of radiation scattered by the target at second and fourth locations, respectively, of the second grating coupler. The second grating coupler couples the second and fourth portions of radiation into the waveguide system. Phase delays of the second and fourth portions of radiation are based on incidences at the second and fourth locations, respectively. The first detector receives a combination of the first and second portions of radiation. The first detector generates a first measurement signal comprising information of the phase delays of the first and second portions of radiation. The second detector receives a combination of the third and fourth portions of radiation. The second detector generates a second measurement signal comprising information of the phase delays of the third and fourth portions of radiation. The processor analyzes the first and second measurement signals. The processor determines a position of the target based on the information of the phase delays of the first and second portions of radiation. The processor determines a correction value for the position based on the information of the phase delays of the third and fourth portions of radiation.

Further features of various aspects of the present disclosure are described in detail below with reference to the accompanying drawings. It is noted that the present disclosure is not limited to the specific aspects described herein. Such aspects are presented herein for illustrative purposes only. Additional aspects will be apparent to those skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable those skilled in the relevant art(s) to make and use aspects described herein.

Figure 6A:
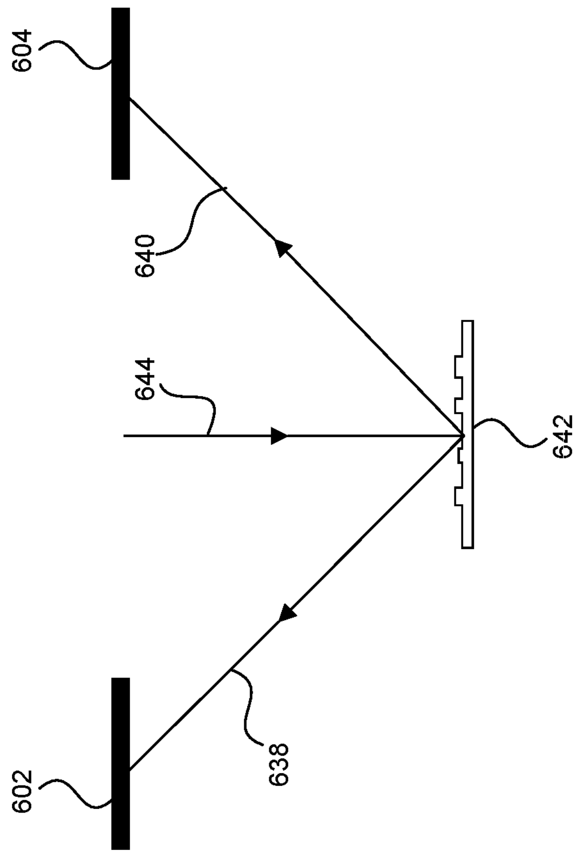
Figure 6C:
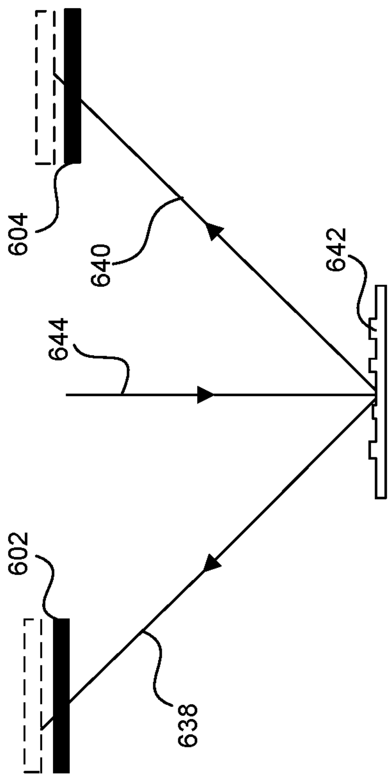
Figure 6B:
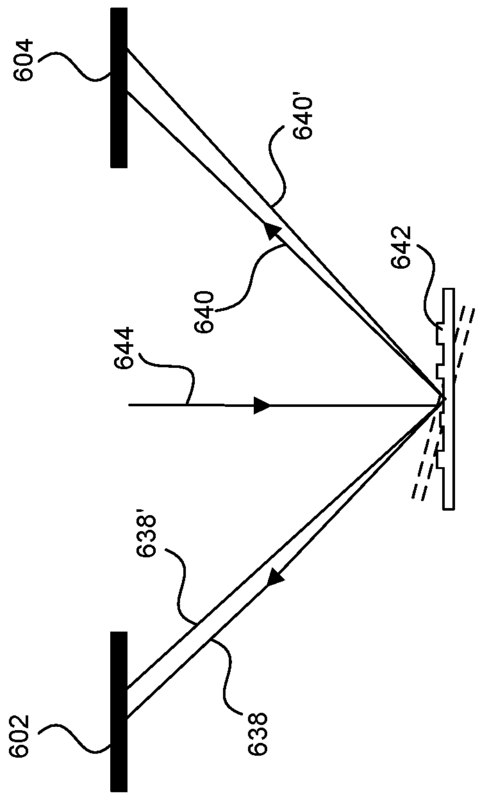

FIGS. 6A, 6B, and 6C show arrangements for collecting radiation scattered by a target, according to some aspects.

Figure 7:
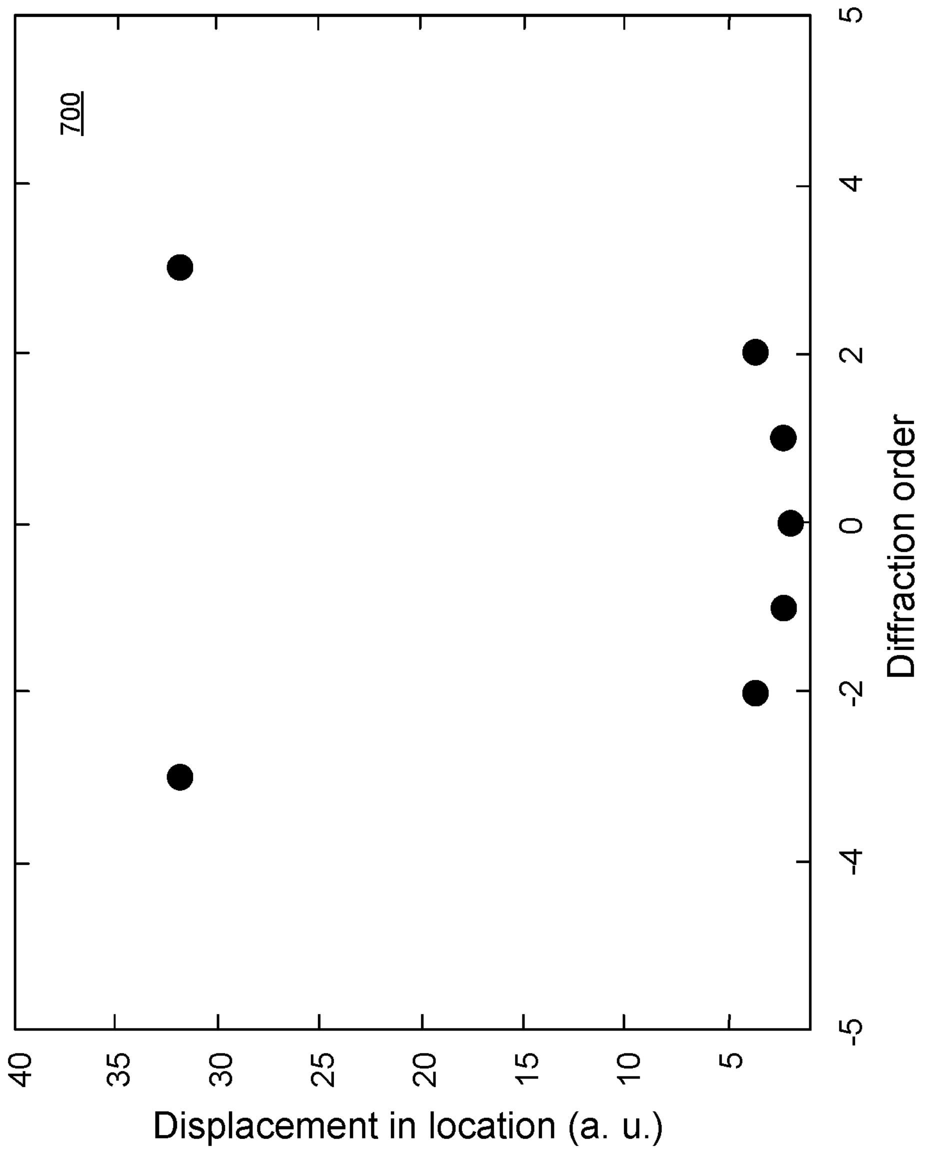
Figure 8:
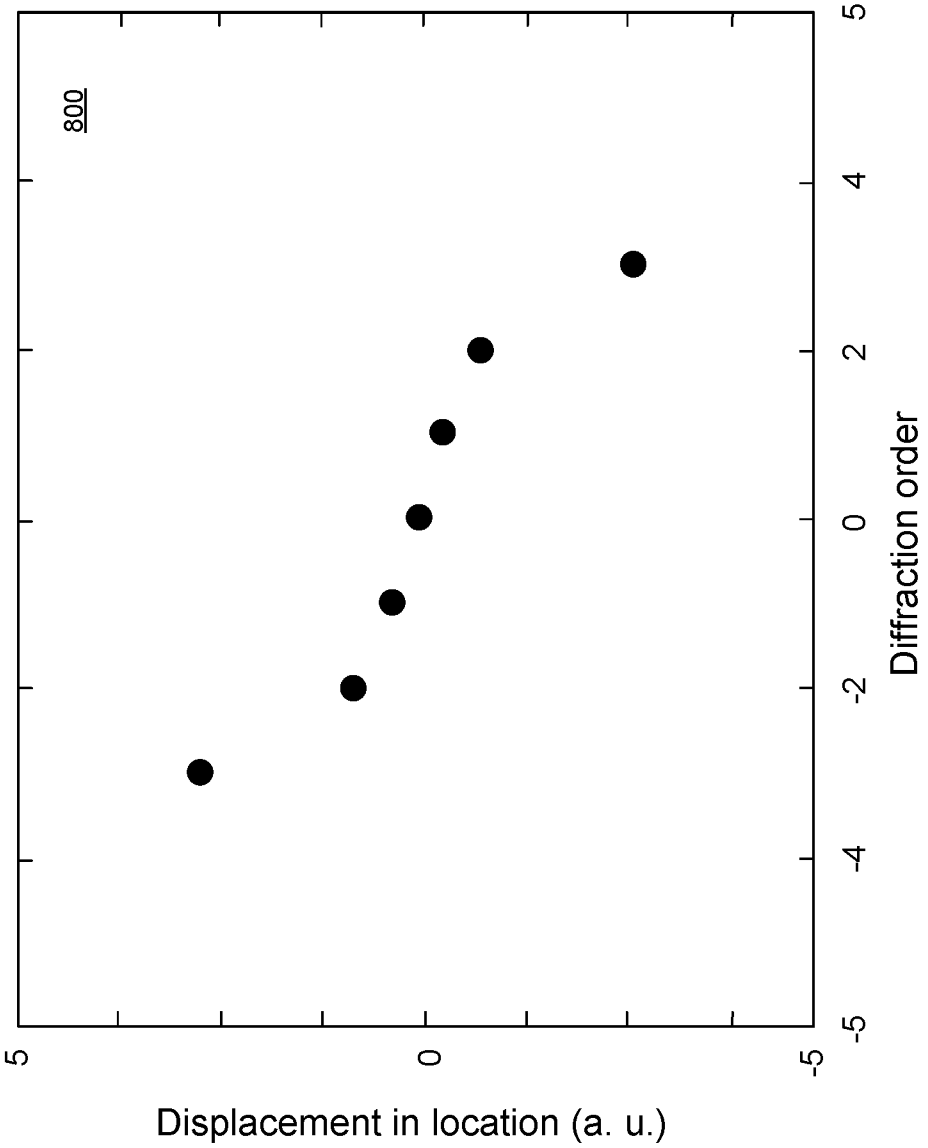

FIGS. 7 and 8 show graph plots corresponding to displacement of scattered radiation, according to some aspects.

FIGS. 9, 10, 11A, and 11B show integrated optical systems, according to some aspects.

Figure 12:
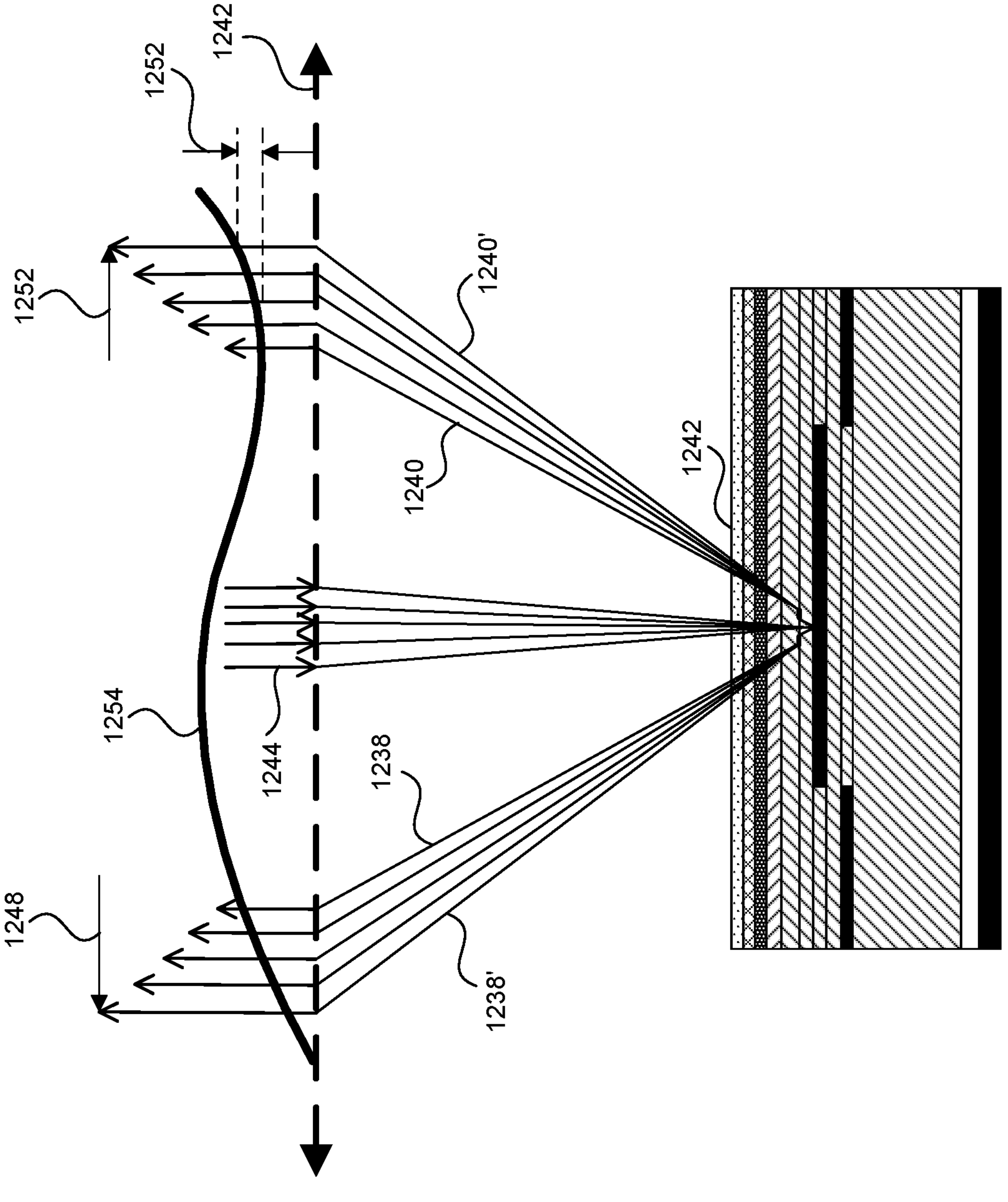

FIG. 12 shows an arrangement for collecting radiation scattered by a target, according to some aspects.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

The aspects described herein, and references in the specification to "one aspect," "an aspect," "an exemplary aspect," "an example aspect," etc., indicate that the aspects described can include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of those skilled in the art to effect such feature, structure, or characteristic in connection with other aspects whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The terms "about," "approximately," or the like can be used herein to indicate the value of a given quantity that can vary based on a particular technology. Based on the particular technology, the terms "about," "approximately," or the like can indicate a value of a given quantity that varies within, for example, 10-30% of the value (e.g., ±10%, ±20%, or ±30% of the value).

Aspects of the present disclosure can be implemented in hardware, firmware, software, or any combination thereof. Aspects of the disclosure can also be implemented as instructions stored on a computer-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Furthermore, firmware, software, routines, and/or instructions can be described herein as performing certain actions. However, it should be appreciated that such descriptions are merely for convenience and that such actions result from computing devices, processors, controllers, or other devices executing the firmware, software, routines, instructions, etc. The term "machine-readable medium" can be interchangeable with similar terms, for example, "computer program product," "computer-readable medium," "non-transitory computer-readable medium," or the like. The term "non-transitory" can be used herein to characterize one or more forms of computer readable media except for a transitory, propagating signal.

Before describing such aspects in more detail, however, it is instructive to present an example environment in which aspects of the present disclosure can be implemented.

Example Lithographic Systems

Figure 1A:
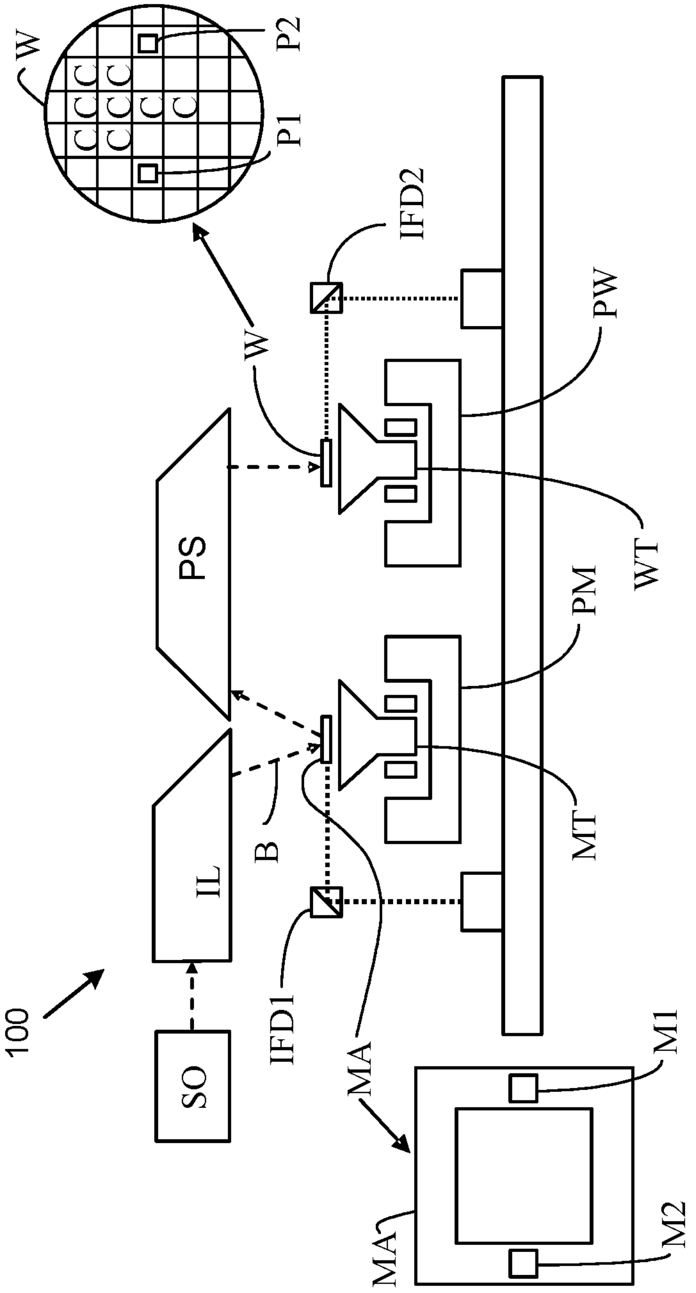
FIG. 1A shows a reflective lithographic apparatus, according to some aspects.
Figure 1B:
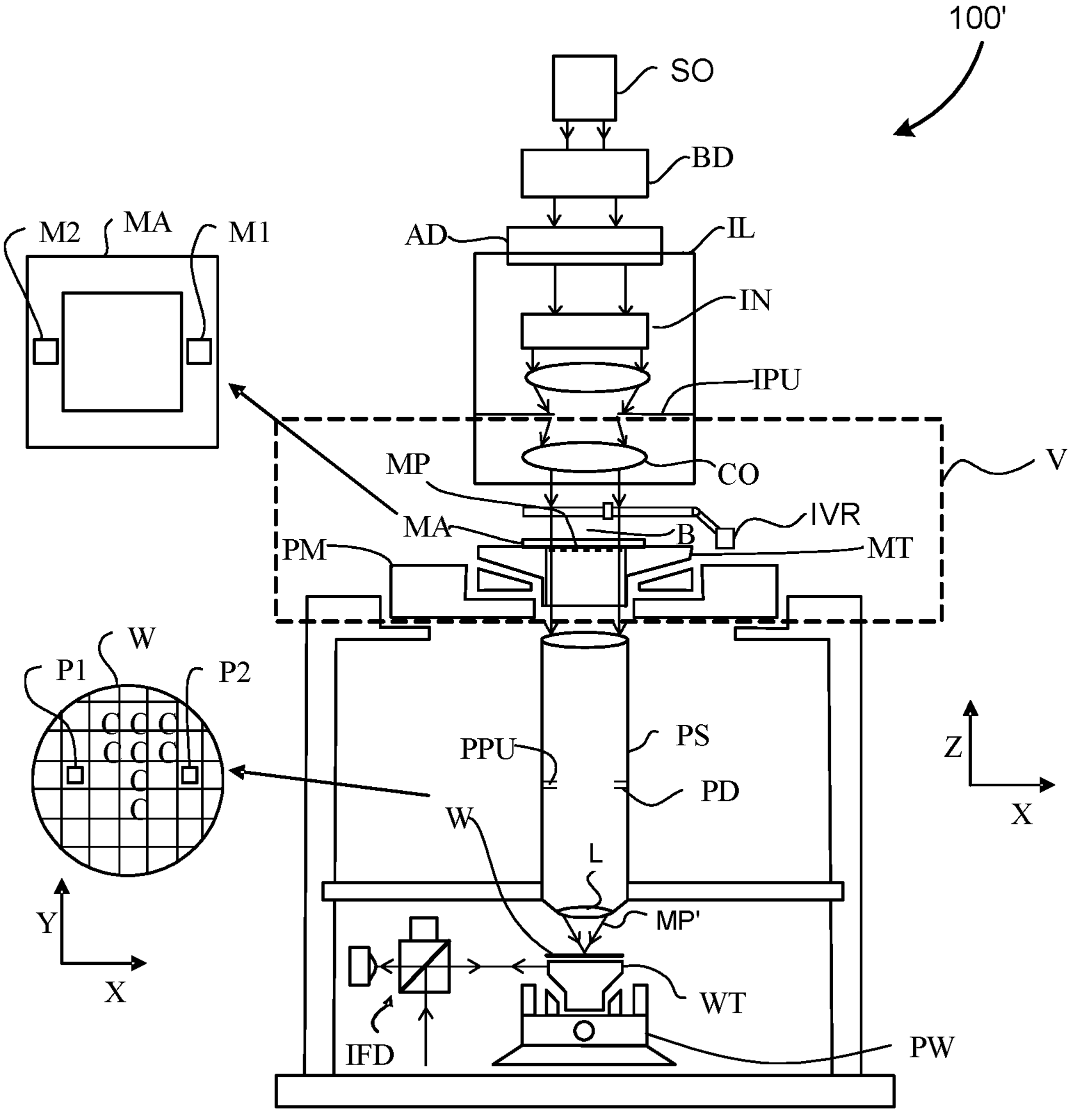
FIG. 1B shows a transmissive lithographic apparatus, according to some aspects.

FIGS. 1A and 1B show a lithographic apparatus 100 and a lithographic apparatus 100', respectively, in which aspects of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid. For example, a liquid can be located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. A radiation system can comprise the source SO, the illuminator IL, and/or the beam delivery system BD.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture (e.g., using a lens or lens group L) the zeroth order diffracted beams, first order diffracted beams, and/or higher order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some aspects, astigmatism aberration can be reduced by providing radiation poles (not shown) in opposite quadrants of the illumination system pupil IPU. Further, in some aspects, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IFD (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots can be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as needed after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further aspect, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
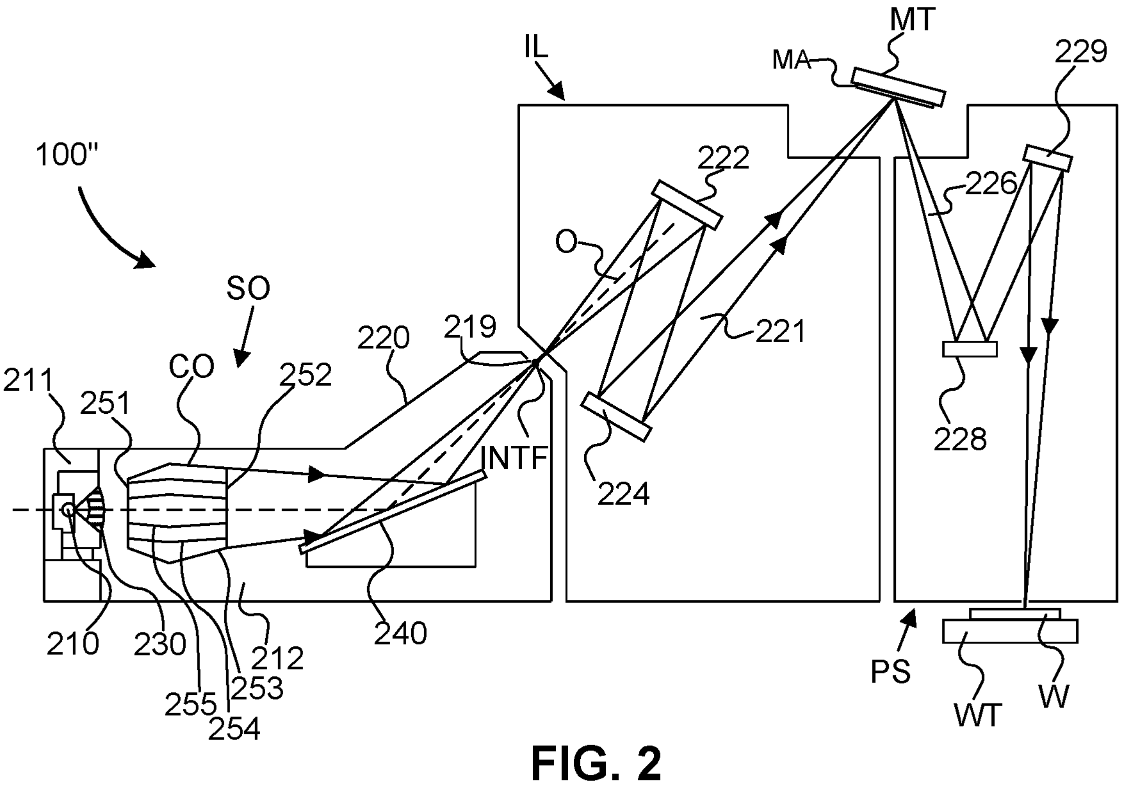
FIG. 2 shows more details of a reflective lithographic apparatus, according to some aspects.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which EUV radiation emitting plasma 210 is created to emit radiation in the EUV range of the electromagnetic spectrum. The EUV radiation emitting plasma 210 is created by, for example, an electrical discharge causing at least a partially ionized plasma. Partial pressures of, for example, 10 Pa of Xe, Li, Sn vapor, or any other suitable gas or vapor can be used for efficient generation of the radiation. In some aspects, a plasma of excited tin (Sn) (e.g., excited via a laser) is provided to produce EUV radiation.

The radiation emitted by the EUV radiation emitting plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point INTF. The virtual source point INTF is commonly referred to as the intermediate focus, and the source collector apparatus is arranged such that the intermediate focus INTF is located at or near an opening 219 in the enclosing structure 220. The virtual source point INTF is an image of the EUV radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Example Lithographic Cell

Figure 3:
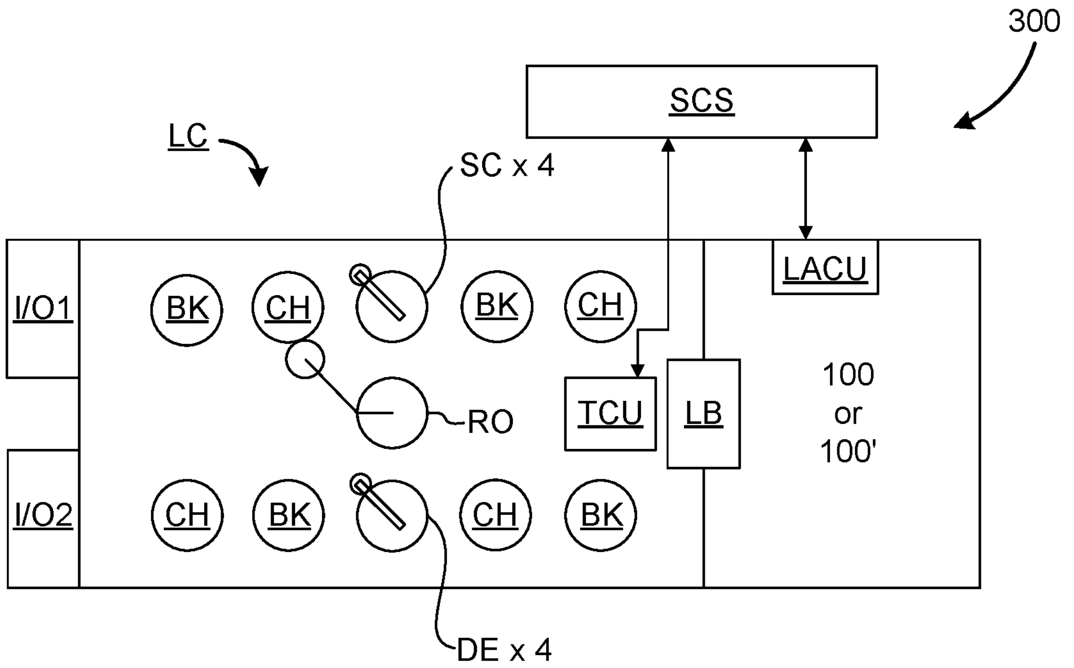
FIG. 3 shows a lithographic cell, according to some aspects.

FIG. 3 shows a lithographic cell 300, also sometimes referred to a lithocell or cluster, according to some aspects. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Inspection Apparatus

In order to control the lithographic process to place device features accurately on the substrate, alignment marks are generally provided on the substrate, and the lithographic apparatus includes one or more inspection apparatuses for accurate positioning of marks on a substrate. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
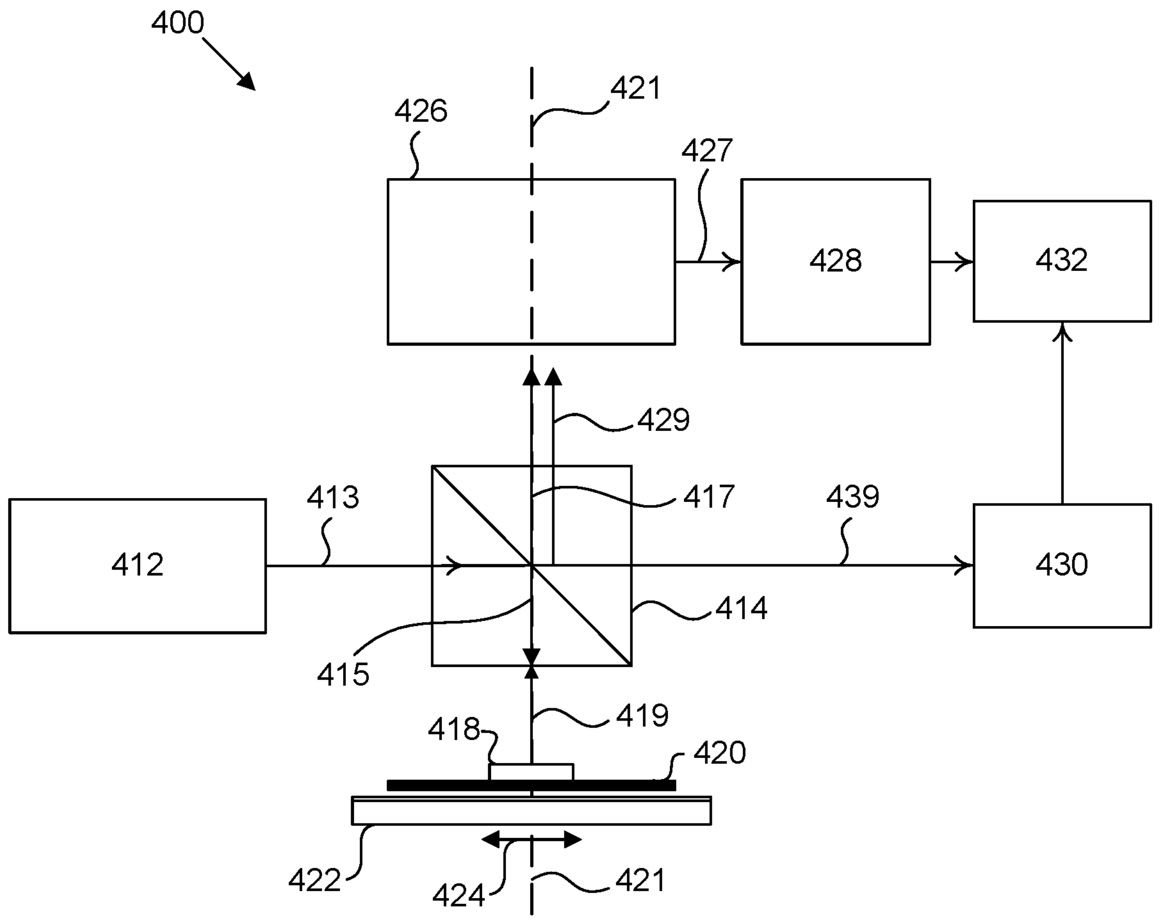
FIGS. 4A and 4B show inspection apparatuses, according to some aspects.

FIG. 4A shows a cross-sectional view of an inspection apparatus 400 that can be implemented as a part of lithographic apparatus 100 or 100', according to some aspects. In some aspects, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

The terms "inspection apparatus," "metrology system," or the like can be used herein to refer to, e.g., a device used for measuring a property of a structure (e.g., overlay sensor, critical dimension sensor, or the like), a device or system used in a lithographic apparatus to inspect an alignment of a wafer (e.g., alignment sensor), or the like.

In some aspects, inspection apparatus 400 can include an illumination system 412, a beam splitter 414, an interferometer 426, a detector 428, a beam analyzer 430, and a processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some aspects, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some aspects, alignment mark or target 418 can have one hundred and eighty degrees (i.e.,) 180° symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some aspects, beam splitter 414 can be further configured to receive diffraction radiation beam 419 and split diffraction radiation beam 419 into at least two radiation sub-beams, according to an aspect. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. Other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example aspect, diffracted radiation sub-beam 429 can be at least a portion of radiation sub-beam 415 that can be reflected from alignment mark or target 418. In an example of this aspect, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed. It can be enough to have the features of alignment mark 418 resolved. Interferometer 426 can be further configured to rotate one of the two images with respect to the other of the two images 180° and recombine the rotated and unrotated images interferometrically.

In some aspects, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example aspect. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further aspect, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can be obtained using any type of alignment sensor, for example, a SMASH (SMart Alignment Sensor Hybrid) sensor, as described in U.S. Pat. No. 6,961,116 that employs a self-referencing interferometer with a single detector and four different wavelengths, and extracts the alignment signal in software, or ATHENA (Advanced Technology using High order ENhancement of Alignment), as described in U.S. Pat. No. 6,297,876, which directs each of seven diffraction orders to a dedicated detector, which are both incorporated by reference herein in their entireties.

In some aspects, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some aspects, beam analyzer 430 can be directly integrated into inspection apparatus 400, or connected via fiber optics of several types: polarization preserving single mode, multimode, or imaging, according to other aspects.

In some aspects, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some aspects, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some aspects, beam analyzer 430 can be further configured to determine a model of the product stack profile of substrate 420, and can be configured to measure overlay, critical dimension, focus, or the like, of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some aspects, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
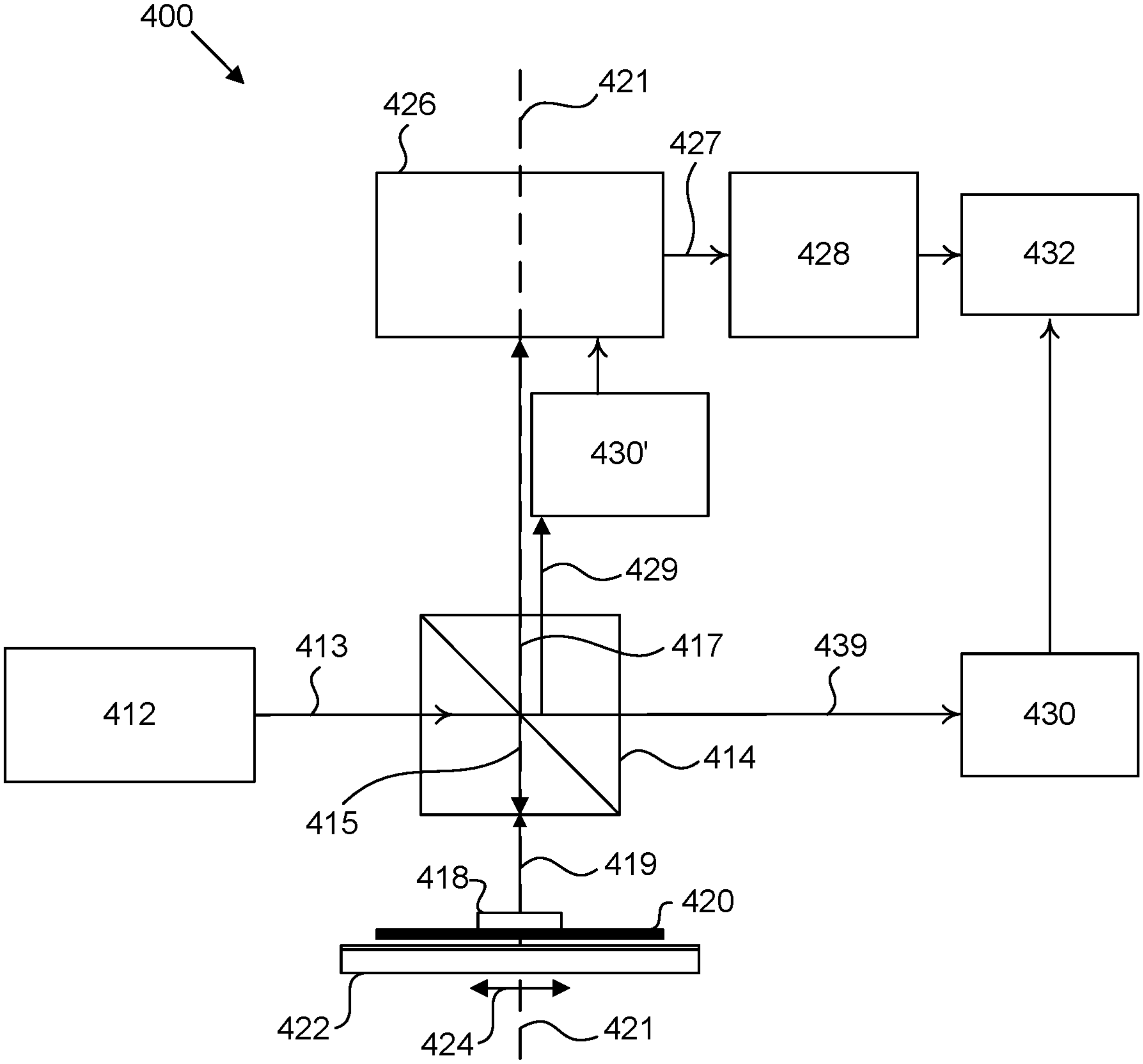

In some aspects, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform one or more of the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, focus, or the like, of target 418 in a single measurement.

In some aspects, second beam analyzer 430' can be directly integrated into inspection apparatus 400, or it can be connected via fiber optics of several types: polarization preserving single mode, multimode, or imaging, according to other aspects. Alternatively, second beam analyzer 430' and beam analyzer 430 can be combined to form a single analyzer (not shown) configured to receive and determine the optical states of both diffracted radiation sub-beams 429 and 439.

In some aspects, processor 432 can determine corrections for each mark.

Example Integrated Optical Systems

In some aspects, the term "throughput" can be used to characterize a rate of lithographic fabrication. For example, throughput can refer to a rate at which lithographic fabrication is completed on wafers, a rate at which a wafer clears a particular fabrication step and moves to the next step, or the like. Throughput can be a performance marker of a lithographic apparatus. It is desirable for lithographic systems to output as many products as possible in as little time as possible. Lithographic fabrication can comprise several complex processes. Each process encompasses choices in technology that compromise between qualities (e.g., sub-nanometer accuracy, high yield) and drawbacks (e.g., slower fabrication, cost). An example process directed to improving accuracy can include inspection of printed marks on a substrate. As described above, an inspection apparatus can be used to ascertain a conformity of a printed pattern on a substrate or to align a substrate in order to properly receive a new pattern. However, the inspection processes can greatly affect throughput (e.g., seeking higher accuracy can increase inspection duration, resulting in reduced throughput). Further examples of integrated optical systems can be found in WO 2021/058571, published Apr. 1, 2021, which is incorporated by reference herein in its entirety.

In some aspects, a plurality of targets can be measured in conjunction with lithographic processes. Throughput can be enhanced by increasing the speed of inspecting multiple targets. While it is possible to implement multiple inspection sensors in parallel inside a lithographic apparatus to speed up inspection of multiple targets, conventional sensors used in lithographic metrology can be large and costly due to their bulk optics, hindering their scalability. A solution can be to implement a sensor that uses a different operating principle, for example, integrated optics. Terms such as "integrated optics," "integrated optical system," "integrated optical circuit," or the like, can be used to refer to integrated devices that can propagate optical signals. For example, an integrated optical device can comprise waveguides disposed on a substrate. The waveguides can guide optical signals to other areas of the substrate, where the optical signals can be received for conversion to measurement information. Integrated optics can be made extremely small compared to bulky free-space optics and at a fraction of the cost. Therefore, sensors based on integrated optics can be a scalable solution to increase the speed of inspecting multiple marks.

Figure 5:
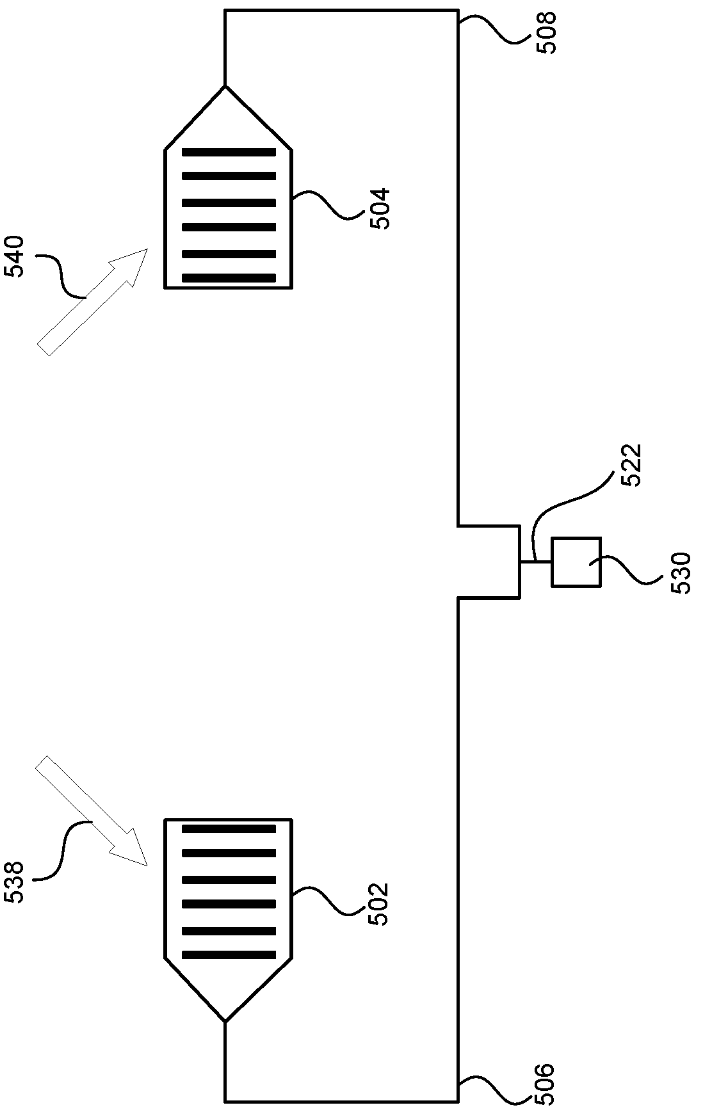
FIG. 5 shows an integrated optical system, according to some aspects.

FIG. 5 shows an integrated optical system 500, according to some aspects. In some aspects, integrated optical system 500 can be used to replace at least a portion of a detection branch of inspection apparatus 400 (FIGS. 4A and 4B). The term "illumination branch," or the like, can refer to the portion of an inspection apparatus that includes devices that source and/or guide illumination toward a target (e.g., radiation sub-beam 415 toward target 418 (FIGS. 4A and 4B)). The term "detection branch," or the like, can refer to the portion of an inspection apparatus that includes devices that guide and/or receive illumination scattered from a target (e.g., diffraction radiation beam 419 from target 418 (FIGS. 4A and 4B)). It should be appreciated that an illumination branch can also be implemented on integrated optics. In some aspects, portions of the illumination branch and detection branch can be implemented on the same substrate (e.g., a shared integrated optical system).

In some aspects, integrated optical system 500 can comprise grating couplers 502 and 504 (e.g., first and second grating couplers), waveguides 506 and 508 (e.g., first and second waveguides, or waveguide system), and a combiner 522. Elements of integrated optical system 500 can be disposed on a substrate (not shown). Integrated optical system 500 can also comprise a detector 530. Alternatively, detector 530 can be a separate element (e.g., not integrated on the substrate).

In some aspects, enumerative adjectives (e.g., "first," "second," "third," or the like) can be used to distinguishing like elements without establishing an order, hierarchy, or numeric correspondence (unless otherwise noted). For example, the terms "first waveguide" and "second waveguide" can distinguish two waveguides without specifying a particular order or hierarchy. Furthermore, an element in a drawing is not limited to any particular enumerative adjective. For example, waveguide 506 can be referred to as a first waveguide or a second waveguide, in which case other waveguide(s) can use appropriately distinguishing enumerative adjective(s).

In some aspects, a radiation source can generate radiation for irradiating a target (e.g., as described in reference to FIGS. 4A and 4B). The target can scatter the radiation (e.g., as one or more diffraction orders, $0^{th}$ order, ±1 order, or the like). The scattered radiation can be received at integrated optical system 500—illustrated as radiation 538 and 540 (e.g., +1 and −1 diffraction orders, +2 and −2 diffraction orders, or the like). Grating coupler 502 can couple radiation 538 into waveguide 506. Grating coupler 504 can couple radiation 540 into waveguide 508. Combiner 522 can combine radiation 538 and 540 (e.g., to perform interferometry). The combined radiation can be received at detector 530. Detector 530 can generate a measurement signal based on the combined radiation.

It is instructive to consider an overview of a process for performing a measurement that relies on a changing characteristic of radiation (e.g., interferometry). As a spot of radiation is moved/scanned across target 418 (FIGS. 4A and 4B), the phases of radiation 538 and 540 (coherent) can evolve over time due to the scanning. As radiation 538 and 540 are interfered (due to combiner 522), the scanning motion of the radiation spot can cause the detected radiation at detector 530 to have AC modulation characteristics. That is, the measurement signal generated by detector 530 can be an AC signal. A property of target 418 (FIGS. 4A and 4B) (e.g., an alignment position) can be inferred from the characteristics of the AC signal (e.g., from the phase of the AC signal).

In some aspects, non-conformities in the inspection process can result in uncertainties in the characteristics of the measurement signal. For example, a tilt or height offset of substrate 420 (FIGS. 4A and 4B) can cause a measured phase to become shifted. A height offset of substrate 420 can also be referred to as defocus. The shift of the phase can be quantified as an offset value of the phase (e.g., a phase offset).

FIGS. 6A, 6B, 6C, 7, and 8 show how wafer tilt and wafer height can influence inspection of a target, according to some aspects. In some aspects, FIGS. 6A, 6B, and 6C can show elements that correspond to similar elements described in reference to FIG. 5. Therefore, unless otherwise noted, descriptions of elements of FIG. 5 can also apply to corresponding elements of FIGS. 6A, 6B, and 6C (e.g., reference numbers sharing the two right-most numeric digits).

FIG. 6A shows an arrangement for collecting radiation scattered by a target 642 that has no tilt or defocus, according to some aspects. In some aspects, radiation 644 from a radiation source can be incident on target 642 on-axis (perpendicular to the plane of the substrate). Radiation scattered from target 642 is shown as radiation 638 and 640. Radiation 638 and 640 can be respectively received at grating couplers 602 and 604—in particularly, received at specific locations of grating couplers 602 and 604.

To contrast, FIG. 6B shows an arrangement for collecting radiation scattered by a target 642 that is tilted, according to some aspects. In some aspects, the tilt of target 642 can cause radiation 638 to change its path to that of radiation 638'. Similarly a path of radiation 640 can change to that of radiation 640'. In this scenario, radiation 638' and 640' can be respectively received at grating couplers 602 and 604, but at locations that are different from the locations specified in FIG. 6A. One of the beams of radiation can travel a shorter path and the other beam compared to the case in which the target is not tilted. This difference in propagation can cause an extra phase difference between radiation 638' and 640'.

FIG. 6C shows an arrangement for collecting radiation scattered by a target 642 that has a defocus, according to some aspects. In another perspective, grating couplers 602 and 604 are set further away from target 642 (away in the vertical direction of the drawing). In some aspects, the defocus can cause radiation 638 and 640 to travel further before being received at grating couplers 602 and 604. In this scenario, radiation 638 and 640 can be respectively received at grating couplers 602 and 604, but at locations that are different from the locations specified in FIG. 6A. Defocus may have a reduced or negligible effect on the interference of radiation 638 and 640 since both beams travel an extra, but equal distance. This behavior can be relied upon in modifying integrated optical system 500 while preserving insensitiveness to defocus.

FIG. 7 shows a graph plot 700 corresponding to displacement of scattered radiation based on a tilted target, according to some aspects. In some aspects, the vertical axis represents a displacement of the location of incidence for different diffraction orders from a target (e.g., target 642 (FIGS. 6A, 6B, and 6C)). The values of displacement are not limiting (e.g., provided in arbitrary units a. u.). The horizontal axis represents the diffraction order. The target tilt was set to 1 urad. The data in graph plot 700 is in agreement with the behavior observed in FIG. 6B. In FIG. 6B a pair of shifted diffraction orders (e.g., +1 and −1) are represented by radiation 638' and 640'. The shift occurs toward the right with respect to radiation 638 and 640 (the direction toward the right is taken as the positive direction). In graph plot 700, the diffraction orders displace toward the right. Higher diffraction orders (e.g., $2^{nd}$, $3^{rd}$, and so on) have more pronounced positive displacements.

FIG. 8 shows a graph plot 800 corresponding to displacement of scattered radiation based on a defocused target, according to some aspects. In some aspects, the vertical axis represents a displacement of the location of incidence for different diffraction orders from a target (e.g., target 642 (FIGS. 6A, 6B, and 6C)). The horizontal axis represents the diffraction order. The target defocus (change in height) was set to 1 nm. The data in graph plot 700 is in agreement with the behavior observed in FIG. 6C. In FIG. 6C a pair of shifted diffraction orders (e.g., +1 and −1) represented by radiation 638 and 640 are allowed to travel further before reaching grating couplers 602 and 604 (the direction toward the right is taken as the positive direction). Radiation 638 (e.g., the positive diffraction order) travels an extra distance to the left before being received at grating coupler 602. Radiation 640 (e.g., the negative diffraction order) travels an extra distance to the right before being received at grating coupler 604. In graph plot 800, the negative diffraction orders displace in the positive direction and the positive diffraction orders displace in the negative direction. Higher diffraction orders (e.g., $2^{nd}$, $3^{rd}$, and so on) have more pronounced displacements.

In some aspects, when beams of radiation received at a grating become shifted, the phase of the scattered radiation can also be affected. Since an interferometry measurement is reliant on phase information, uncertainty in the tilt or defocus of a target can translate to a phase uncertainty in the interferometry measurement. This is very undesirable as lithographic processes loathe to part with even a few picometers of positioning accuracy. The phase uncertainty can be lifted if, for example, a tilt and/or height measurement is performed on target 642 (FIGS. 6A, 6B, and 6C). In some aspects, a tilt and/or wafer level sensor can be implemented so as to quantify the effects tilt and/or defocus. The quantified tilt and/or defocus effects can then be analyzed to calculate correction values to the concerned measured property (in this non-limiting example, the concerned measured property is an alignment position of a target). However, conventional tilt and wafer level sensors have a large construction based around conventional bulk optics, hindering scalability.

Therefore, in some aspects, it is envisaged to modify integrated optical system 500 to achieve an inspection system capable of quantifying a primary measured property (e.g., alignment position) while also quantifying one or more correction values for the measured property (e.g., a tilt and/or defocus offset) (as opposed to using discrete sensors to independently measure the property and the correction value(s)).

Figure 9:
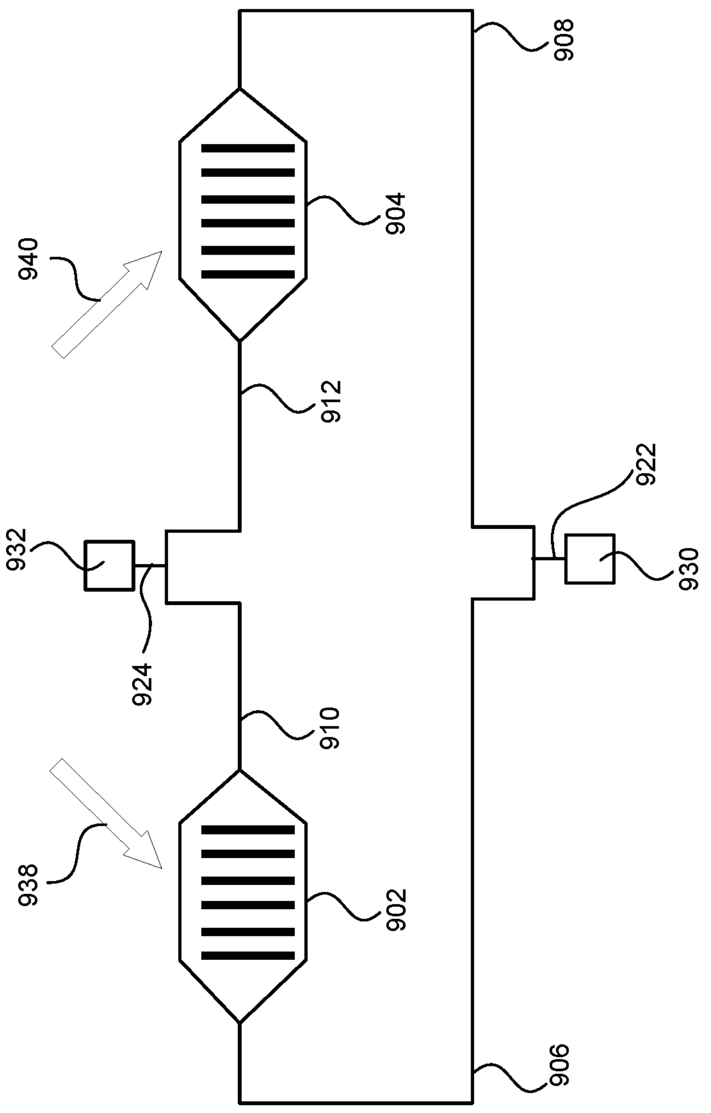

FIG. 9 shows an integrated optical system 900, according to some aspects. In some aspects, integrated optical system 900 can be used to replace at least a portion of a detection branch of inspection apparatus 400 (FIGS. 4A and 4B). In some aspects, FIG. 9 can show elements that correspond to similar elements described in reference to FIG. 5. Therefore, unless otherwise noted, descriptions of elements of FIG. 5 can also apply to corresponding elements of FIG. 9 (e.g., reference numbers sharing the two right-most numeric digits).

In some aspects, integrated optical system 900 can comprise grating couplers 902 and 904 (e.g., first and second grating couplers), waveguides 906, 908, 910, and 912 (e.g., first, second, third, and fourth waveguides, or waveguide system), and combiners 922 and 924 (e.g., first and second combiners). Elements of integrated optical system 900 can be disposed on a substrate (not shown). Integrated optical system 900 can also comprise a detectors 930 and 932 (e.g., first and second detectors). Alternatively, detectors 930 and 932 can be elements that are not integrated on the substrate.

In some aspects, radiation scattered by a target can be received at integrated optical system 900—illustrated as radiation 938 and 940 (e.g., +1 and −1 diffraction orders, +2 and −2 diffraction orders, or the like). Grating coupler 902 can couple portions of radiation 938 into waveguides 906 and 910. Grating coupler 904 can couple radiation 940 into waveguides 908 and 912. Integrated optical system 900 is different from optical system 500 (FIG. 5) in that each grating coupler of optical system 900 functions to split portions of received radiation along a plurality of waveguide paths. In a non-limiting example of nomenclature, it can be described that a first grating coupler can couple first and third portions of radiation scattered by the target respectively into first and third waveguides. Similarly, a second grating coupler can couple second and fourth portions of radiation scattered by the target respectively into second and fourth waveguides.

In some aspects, combiner 922 can combine portions of radiation 938 and 940 (e.g., to perform interferometry). Combiner 924 can combine other portions of radiation 938 and 940. Described in the previously suggested nomenclature, a first combiner connected to the first and second waveguides can combine the first and second portions of radiation. A second combiner connected to the third and fourth waveguides and configured to combine the third and fourth portions of radiation.

In some aspects, detector 930 can receive the portions of radiation that were combined by combiner 922. Detector 930 can generate a measurement signal based on the combined radiation from combiner 922. Detector 932 can receive the portions of radiation that were combined by combiner 924. Detector 932 can generate a measurement signal based on the combined radiation from combiner 924. Described in the previously suggested nomenclature, a first detector can receive the combined first and second portions of radiation from the first combiner and can generate a first measurement signal based on the combined first and second portions of radiation. A second detector can receive the combined third and fourth portions of radiation from the second combiner and can generate a second measurement signal based on the combined third and fourth portions of radiation.

In some aspects, interference measured at detectors 930 and 932 can be represented by equations 1 and 2:

$$I_{930} = I_{906}\, e^{-i\Delta x_{938} k_{938} n_{eff}} + I_{908}\, e^{-i\Delta x_{940} k_{940} n_{eff}}, \tag{1}$$

$$I_{932} = I_{910}\, e^{-i\Delta x_{938} k_{938} n_{eff}} + I_{912}\, e^{-i\Delta x_{940} k_{940} n_{eff}}. \tag{2}$$

Here, the subscripts of the intensities I correspond to the waveguides and detectors in FIG. 9 (e.g., 1930 corresponds to the intensity of radiation received by detector 930). Other quantities include $\Delta x_{938}$ (displacement of the beam of radiation 938 incident on grating coupler 902), $\Delta x_{940}$ (displacement of the beam of radiation 940 incident on grating coupler 904), $k_{938}$ (wave vector of radiation 938 in free space), $k_{940}$ (wave vector of radiation 940 in free space), and $n_{eff}$ for the effective index of the grating couplers (for simplification, it has been assumed that $n_{eff}$ is the same for both grating couplers, but it is also envisaged each grating coupler can have different values for $n_{eff}$). As shown in FIGS. 7 and 8, higher diffraction angles can correspond to larger displacements Δx. High diffraction angles can also be a result of small pitch for grating targets. Hence, higher diffraction orders and/or high-pitch grating targets can be more sensitive to the effects of target tilting and/or defocus.

In some aspects, measurements performed by a single detector system (e.g., detector 530 of FIG. 5) can have the drawback of having an error in the calculation of a measured property of a target due to a phase offset due to target tilt or defocus. To correct the effects of target tilt or defocus, extra measurements can be performed. Using additional tilt and/or wafer level sensors can have drawbacks as previously described. Therefore, integrated optical system 900 has additional measurement functionality to allow additional measurements (e.g., more than one detector and corresponding optical circuitry). As radiation 938 and 940 become more displaced on grating couplers 902 and 904 (e.g., due to tilt and/or defocus), the phase of the combined radiation received at detector 930 can change independently (or semi-independently) from the phase of the combined radiation received at detector 932. If an alignment position of a mark is a first unknown to be solved, and an error due to tilt is a second unknown to be solved, then the two different phases measured at detectors 930 and 932 can be used to extract the two unknowns. Furthermore, it is envisaged that the amount of tilt can also be extracted, effectively allowing an inspection apparatus comprising integrated optical system 900 to be used as a multipurpose sensor for measuring both alignment position and tilt angle of a target/wafer.

In some aspects, additional measurement capability can be implemented for an increasing number of unknowns. Furthermore, by using integrated optics, it is possible to add the measurement capability with minimal impact to sensor size, allowing for a scalable system.

Figure 10:
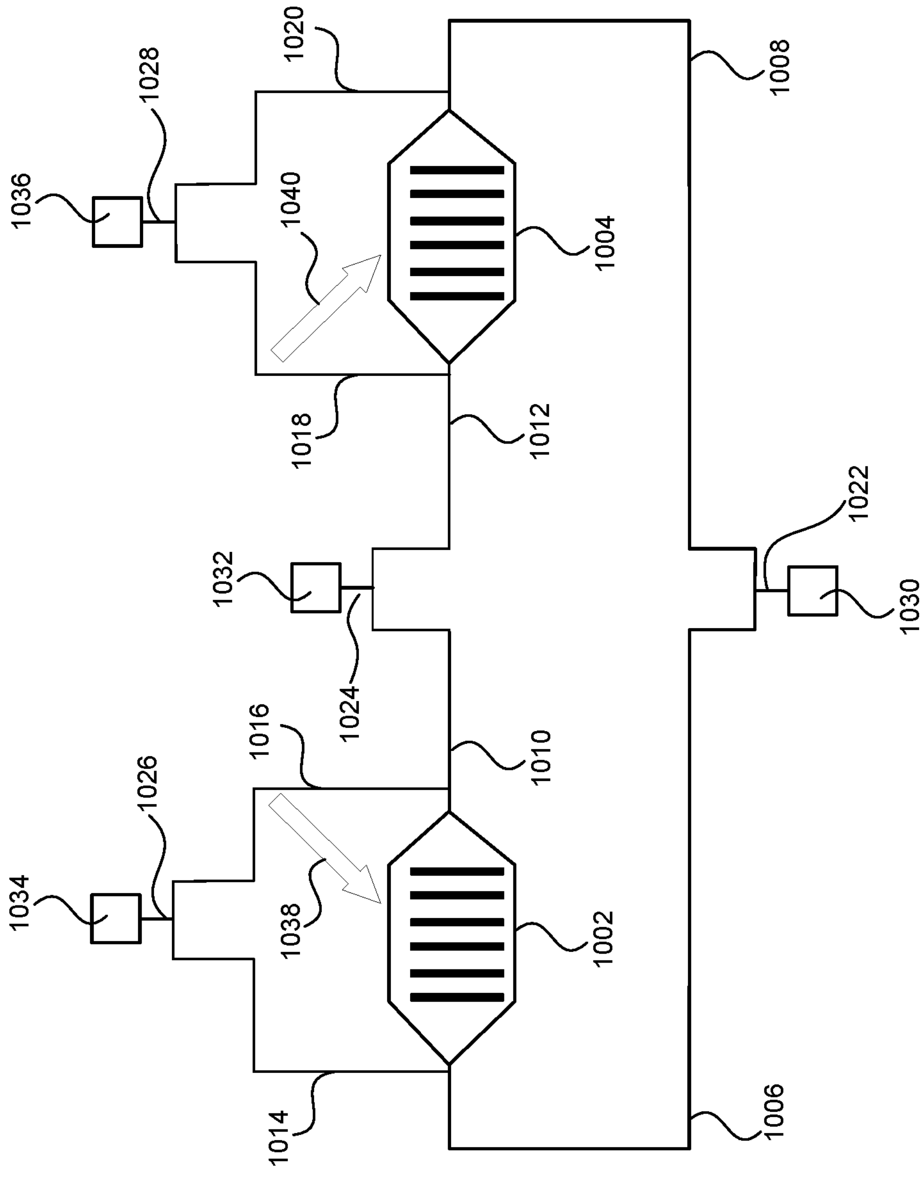

FIG. 10 shows an integrated optical system 1000, according to some aspects. In some aspects, integrated optical system 1000 can be used to replace at least a portion of a detection branch of inspection apparatus 400 (FIGS. 4A and 4B). In some aspects, FIG. 10 can show elements that correspond to similar elements described in reference to FIGS. 5 and 9. Therefore, unless otherwise noted, descriptions of elements of FIGS. 5 and 9 can also apply to corresponding elements of FIG. 10 (e.g., reference numbers sharing the two right-most numeric digits).

In some aspects, integrated optical system 1000 can comprise grating couplers 1002 and 1004 (e.g., first and second grating couplers), waveguides 1006, 1008, 1010, 1012, 1014, 1016, 1018, and 1020 (e.g., first through eighth waveguides), and combiners 1022, 1024, 1026, and 1028 (e.g., first through fourth combiners). Though not labeled, it should be understood that branching sections of waveguides can comprise beam splitters for splitting light in one waveguide such that the light can travel in two or more waveguides. For example, waveguide 1006 has a branch that becomes waveguide 1014. It should be appreciated that such branching of waveguides can comprise a beam splitter (e.g., an optical element that functions in a reverse fashion of the combiners), or the like optical component(s). Elements of integrated optical system 1000 can be disposed on a substrate (not shown). Integrated optical system 1000 can also comprise a detectors 1030, 1032, 1034, and 1036 (e.g., first through fourth detectors). Alternatively, detectors 1030, 1032, 1034, and 1036 can be elements that are not integrated on the substrate.

In some aspects, radiation scattered by a target can be received at integrated optical system 1000—illustrated as radiation 1038 and 1040 (e.g., +1 and −1 diffraction orders, +2 and −2 diffraction orders, or the like). Grating coupler 1002 can couple portions of radiation 1038 (e.g., first through fourth portions) into waveguides 1006, 1010, 1014, and/or 1016. Grating coupler 1004 can couple portions of radiation 1040 (e.g., fifth through eighth portions) into waveguides 1008, 1012, 1018, and/or 1020. In general, grating couplers can be configured to separate and couple radiation into different waveguide tracks based on one or more properties of the radiation (e.g., properties such as polarization, wavelength, or the like). Some examples of multidirectional grating coupler designs can be found in Piggott et al., "Inverse design and implementation of a wavelength demultiplexing grating coupler", Scientific reports, 4(1), 1-5 (2014) and Van Laere et al., "Focusing polarization diversity grating couplers in silicon-on-insulator", Journal of Lightwave Technology, 27(5), 612-618 (2009), which are both incorporated by reference herein in their entireties. The grating couplers used in aspects disclosed herein can be one dimensional gratings, two-dimensional gratings, or other types of gratings. In some aspects, grating couplers 1002 and 1004 can split portions of radiation such that intensity is divided approximately 50/50 among two waveguides (e.g., or 80/20, 70/30, or the like), approximately 33/33/33 among three waveguides, approximately 25/25/25/25 among four waveguides, or the like. Other percentages are also envisaged (e.g., unequal distribution of percentages).

In some aspects, with more independent or semi-independent phases measured, additional information can be extracted from a measurement of a target. For example, it is envisaged that the amount of tilt and/or wafer level can also be extracted, effectively allowing an inspection apparatus comprising integrated optical system 1000 to be used as a multipurpose sensor for measuring alignment position, tilt angle of a target/wafer, and a height (defocus) of the target/wafer.

In some aspects, integrated optical systems described herein can be adapted to have a simplified optical circuit for isolated functions, for example, height (defocus) measurement of a target/wafer.

Figure 11B:
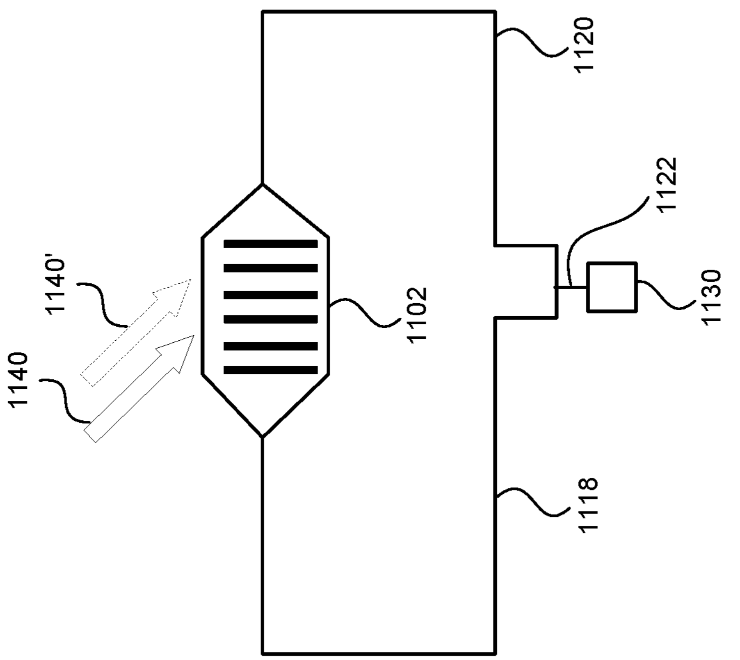
Figure 11A:
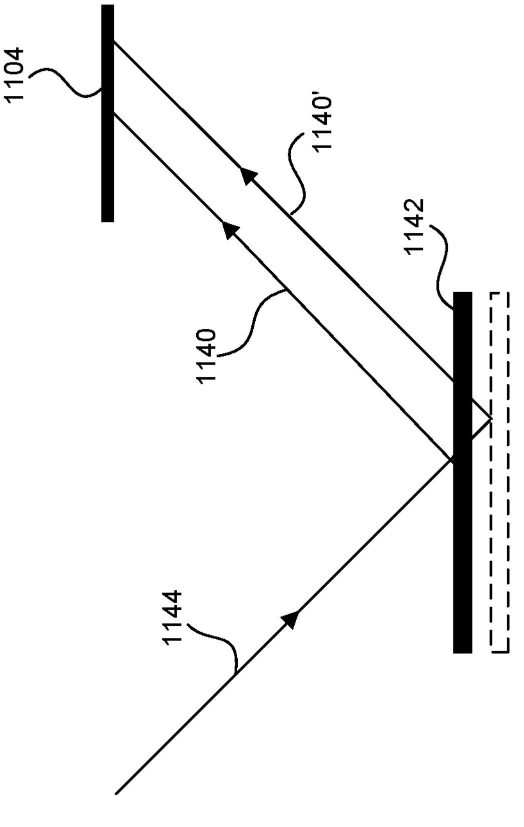

FIGS. 11A and 11B show an integrated optical system 1100 used for height level measurements (e.g., height of a target or wafer), according to some aspects. FIG. 11A shows an arrangement for collecting radiation scattered by a target 1142 that has an adjusted height. In some aspects, target 1142 can be irradiated by radiation 1144 from a radiation source. The scattered radiation from target 1142 can be represented by radiation 1140 for one height level of target 1142. The scattered radiation from target 1142 can be represented by radiation 1140' for another height level of target 1142. Radiation 1140 and 1140' can be received at a grating coupler 1104.

FIG. 11B shows integrated optical system 1100 that comprises grating coupler 1104. In some aspects, FIGS. 11A and 11B can show elements that correspond to similar elements described in reference to FIGS. 5, 9, and 10. Therefore, unless otherwise noted, descriptions of elements of FIGS. 5, 9, and 10 can also apply to corresponding elements of FIGS. 11A and 11B (e.g., reference numbers sharing the two right-most numeric digits).

In some aspects, integrated optical system 1100 can also comprise waveguides 1118 and 1120 (e.g., first and second waveguides) and a combiner 1128. Elements of integrated optical system 1000 can be disposed on a substrate (not shown). Integrated optical system 1100 can also comprise a detector 1130. Alternatively, detector 1130 can be an element that is not integrated on the substrate.

In some aspects, radiation 1144 is not on-axis (perpendicular to the surface), but rather is incident at a non-zero angle of incidence. Due to variations of the height of target 1142, the receiving location on grating coupler 1104 changes, as shown by the difference between radiation 1140 and 1140'. As a result, the interference at detector 1136 can change commensurately, which can be used to estimate the height variation. In this manner, integrated optical system 1100 can allow for a very compact sensor for measuring height or distance variations. In some aspects, integrated optical system 1100 can be combined with integrated optical systems 900 and/or 1000 (FIGS. 9 and 10) to create a hybrid measurement system.

In some aspects, inspection systems disclosed herein can comprise an analyzer (e.g., processor 432) for analyzing measurement signals from detectors. For example, the processor can analyze first and second measurement signals from respective first and second detectors. The processor can determine a position of a target based on the analyzing of the first measurement signal and a correction value for the position based on the analyzing of the second measurement signal. The correction value can correspond to one of a tilt, defocus, stack profile, or the like, of a target. A second correction value can be determined, which can correspond to another one of the tilt, defocus, stack profile, or the like, of the target.

In some aspects, tilt and defocus of a target are not the only mechanisms capable of shifting a spot of radiation on a grating coupler. For example, lithographic fabrication can include stacking multiple layers of patterns on a substrate.

FIG. 12 shows an arrangement for collecting radiation scattered by a target 1242 that has lithographically stacked layers (or stack), according to some aspects. A beam of radiation 1244 can be incident on target 1242 on-axis. Radiation 1244 can be sourced from a radiation source. Radiation 1244 can be focused using an objective 1246. Objective 1246 can be disposed at a pupil plane. Target 1242 can scatter radiation 1244 to generate scattered radiation 1238 and 1240 (e.g., +1 and −1 diffraction orders, +2 and −2 diffraction orders, or the like).

In some aspects, the angular spectrum of the propagating radiation inside the stack can vary. This can lead to a shift of the perceived point of scattering at target 1242. Furthermore, stack spectral reflectance can also cause a shift in central wavelength. As a result, non-zero diffraction orders can diffract at different from expected angles (shown as radiation 1238' and 1240') and the diffraction orders can displace at the pupil plane by an amount indicated by displacements 1248 and 1250, along with a corresponding phase shift 1252. Hence, if a total height map is known by another measurement, the stack variation can be measured using the setup illustrated in, for example, FIG. 10, 11A, or 11B.

In some aspects, a wavefront 1254 of radiation at objective 1246 can have aberrations (e.g., the wavefront is not a uniform wavefront). Aspects of integrated optical systems described herein can be used to arrive at accurate correction values even in systems that are sensitive to non-uniform wavefronts, pupil spot shift, and/or wavelength shift.

The embodiments may further be described using the following clauses:

1. An inspection system comprising:

a radiation source configured to generate radiation to irradiate a target;

an integrated optical system comprising:
a substrate;
first, second, third, and fourth waveguides disposed on the substrate;
first and second grating couplers disposed on the substrate, wherein
the first grating coupler is configured to couple first and third portions of radiation scattered by the target respectively into the first and third waveguides, and
the second grating coupler is configured to couple second and fourth portions of radiation scattered by the target respectively into the second and fourth waveguides;
a first combiner coupled to the first and second waveguides, disposed on the substrate, and configured to combine the first and second portions of radiation; and
a second combiner coupled to the third and fourth waveguides, disposed on the substrate and configured to combine the third and fourth portions of radiation;
a first detector configured to receive the combined first and second portions of radiation from the first combiner and to generate a first measurement signal based on the combined first and second portions of radiation; and
a second detector configured to receive the combined third and fourth portions of radiation from the second combiner and to generate a second measurement signal based on the combined third and fourth portions of radiation.

2. The inspection system of clause 1, further comprising a processor configured to:
analyze the first and second measurement signals; and
determine a position of the target based on the analyzing of the first measurement signal and a correction value for the position based on the analyzing of the second measurement signal.

3. The inspection system of clause 2, wherein the correction value corresponds to a tilt, defocus, or a layer stack profile of the target.

4. The inspection system of clause 1, wherein the first and second detectors are disposed on the substrate.

5. The inspection system of clause 1, wherein:
the integrated optical system further comprises fifth and sixth waveguides disposed on the substrate;
the first grating coupler is configured to couple fifth and sixth portions of radiation scattered by the target respectively into the fifth and sixth waveguides;
the integrated optical system further comprises a third combiner coupled to the fifth and sixth waveguides, disposed on the substrate, and configured to combine the fifth and sixth portions of radiation; and
the inspection system further comprises a third detector configured to receive the combined fifth and sixth portions of radiation from the third combiner and to generate a third measurement signal based on the combined first and second portions of radiation.

6. The inspection system of clause 5, further comprising a processor configured to:
analyze the first, second, and third measurement signals; and
determine a position of the target based on the analyzing of the first measurement signal, a first correction value for the position based on the analyzing of the second measurement signal, and a second correction value for the position based on the analyzing of the third measurement signal.

7. The inspection system of clause 6, wherein:
the first correction value corresponds to one of a tilt, defocus, or a layer stack profile of the target; and
the second correction value corresponds to a different one of the tilt, defocus, or a layer stack profile of the target.

8. The inspection system of clause 1, wherein:
the integrated optical system further comprises:
fifth and sixth waveguides disposed on the substrate;
a third grating coupler disposed on the substrate and configured to couple fifth and sixth portions of radiation scattered by the target respectively into the fifth and sixth waveguides; and
a third combiner coupled to the fifth and sixth waveguides, disposed on the substrate, and configured to combine the fifth and sixth portions of radiation; and
the inspection system further comprises a third detector configured to receive the combined fifth and sixth portions of radiation from the third combiner and to generate a third measurement signal based on the combined first and second portions of radiation.

9. The inspection system of clause 8, further comprising a processor configured to:
analyze at least the third measurement signals; and
determine a defocus of the target based on the analyzing of the third measurement signal.

10. The inspection system of clause 1, wherein:
the first grating coupler is further configured perform the coupling of the first and third portions of radiation such that the first and third portions of radiation have approximately equal intensity; and
the second grating coupler is further configured perform the coupling of the second and fourth portions of radiation such that the second and fourth portions of radiation have approximately equal intensity.

11. A lithographic apparatus comprising:
an illumination system configured to illuminate a pattern of a patterning device;
a projection system configured to project an image of the pattern onto a wafer; and
an inspection system comprising:
a radiation source configured to generate radiation to irradiate a target;
an integrated optical system comprising:
a substrate;
first, second, third, and fourth waveguides disposed on the substrate;
first and second grating couplers disposed on the substrate, wherein
the first grating coupler is configured to couple first and third portions of radiation scattered by the target respectively into the first and third waveguides, and
the second grating coupler is configured to couple second and fourth portions of radiation scattered by the target respectively into the second and fourth waveguides;
a first combiner coupled to the first and second waveguides, disposed on the substrate, and configured to combine the first and second portions of radiation; and
a second combiner coupled to the third and fourth waveguides, disposed on the substrate and configured to combine the third and fourth portions of radiation;

a first detector configured to receive the combined first and second portions of radiation from the first combiner and to generate a first measurement signal based on the combined first and second portions of radiation; and a second detector configured to receive the combined third and fourth portions of radiation from the second combiner and to generate a second measurement signal based on the combined third and fourth portions of radiation.

12. The lithographic apparatus of clause 11, further comprising a processor configured to:

analyze the first and second measurement signals; and determine a position of the target based on the analyzing of the first measurement signal and a correction value for the position based on the analyzing of the second measurement signal.

13. The lithographic apparatus of clause 12, wherein the correction value corresponds to a tilt, defocus, or a layer stack profile of the target.

14. The lithographic apparatus of clause 11, wherein the first and second detectors are disposed on the substrate.

15. The lithographic apparatus of clause 11, wherein:

the integrated optical system further comprises fifth and sixth waveguides disposed on the substrate;

the first grating coupler is configured to couple fifth and sixth portions of radiation scattered by the target respectively into the fifth and sixth waveguides;

the integrated optical system further comprises a third combiner coupled to the fifth and sixth waveguides, disposed on the substrate, and configured to combine the fifth and sixth portions of radiation; and the inspection system further comprises a third detector configured to receive the combined fifth and sixth portions of radiation from the third combiner and to generate a third measurement signal based on the combined first and second portions of radiation.

16. The lithographic apparatus of clause 15, further comprising a processor configured to:

analyze the first, second, and third measurement signals; and determine a position of the target based on the analyzing of the first measurement signal, a first correction value for the position based on the analyzing of the second measurement signal, and a second correction value for the position based on the analyzing of the third measurement signal.

17. The lithographic apparatus of clause 16, wherein:

the first correction value corresponds to one of a tilt, defocus, or a layer stack profile of the target; and the second correction value corresponds to a different one of the tilt, defocus, or a layer stack profile of the target.

18. The inspection system of clause 11, wherein:

the integrated optical system further comprises:

fifth and sixth waveguides disposed on the substrate;

a third grating coupler disposed on the substrate and configured to couple fifth and sixth portions of radiation scattered by the target respectively into the fifth and sixth waveguides; and a third combiner coupled to the fifth and sixth waveguides, disposed on the substrate, and configured to combine the fifth and sixth portions of radiation; and the inspection system further comprises a third detector configured to receive the combined fifth and sixth portions of radiation from the third combiner and to generate a third measurement signal based on the combined first and second portions of radiation.

19. The inspection system of clause 18, further comprising a processor configured to:

analyze at least the third measurement signals; and determine a defocus of the target based on the analyzing of the third measurement signal.

20. The inspection system of clause 11, wherein:

the first grating coupler is further configured perform the coupling of the first and third portions of radiation such that the first and third portions of radiation have approximately equal intensity; and the second grating coupler is further configured perform the coupling of the second and fourth portions of radiation such that the second and fourth portions of radiation have approximately equal intensity.

21. A method comprising:

generating radiation to irradiate a target;

receiving first and third portions of radiation scattered by the target at first and third locations, respectively, of a first grating coupler, wherein phase delays of the first and third portions of radiation are based on incidences at the first and third locations, respectively;

receiving second and fourth portions of radiation scattered by the target at second and fourth locations, respectively, of a second grating coupler, wherein phase delays of the second and fourth portions of radiation are based on incidences at the second and fourth locations, respectively;

combining the first and second portions of radiation;

generating a first measurement signal comprising information of the phase delays of the first and second portions of radiation based on the combination of the first and second portions of radiation;

combining the third and fourth portions of radiation;

generating a second measurement signal comprising information of the phase delays of the third and fourth portions of radiation based on the combination of the third and fourth portions of radiation;

determining a position of the target based on analyzing information of the phase delays of the first and second portions of radiation; and determining a correction value for the position based on analyzing the information of the phase delays of the third and fourth portions of radiation.

22. An inspection system comprising:

a radiation source configured to generate radiation to irradiate a target;

an integrated optical system comprising:

a substrate;

a waveguide system disposed on the substrate; and first and second grating couplers disposed on the substrate, wherein the first grating coupler is configured receive first and third portions of radiation scattered by the target at first and third locations, respectively, of the first grating coupler and to couple the first and third portions of radiation into the waveguide system, phase delays of the first and third portions of radiation are based on incidences at the first and third locations, respectively, the second grating coupler is configured receive second and fourth portions of radiation scattered by the target at second and fourth locations, respectively, of the second grating coupler and to couple the second and fourth portions of radiation into the waveguide system, and phase delays of the second and fourth portions of radiation are based on incidences at the second and fourth locations, respectively;

a first detector configured to receive a combination of the first and second portions of radiation to generate a first measurement signal comprising information of the phase delays of the first and second portions of radiation;

a second detector configured to receive a combination of the third and fourth portions of radiation and to generate a second measurement signal comprising information of the phase delays of the third and fourth portions of radiation; and a processor configured to:

analyze the first and second measurement signals;

determine a position of the target based on the information of the phase delays of the first and second portions of radiation; and determine a correction value for the position based on the information of the phase delays of the third and fourth portions of radiation.

The terms "radiation," "beam," "light," "illumination," or the like can be used herein to refer to one or more types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-100 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some aspects, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Although some aspects of the present disclosure are described in the context of lithographic apparatuses in the manufacture of ICs, it should be understood that lithographic apparatuses described herein can be used in other applications, for example, in the manufacture of integrated optical systems, guidance and detection patterns for magnetic domain memories, flat-panel displays, LCDs, thin-film magnetic heads, etc. Those skilled in the art will appreciate that, in the context of such alternative applications, any use of the terms "wafer" or "die" herein can be considered as specific examples of the more general terms "substrate" or "target portion", respectively. A substrate can be processed before or after exposure in, for example, a track unit (a tool that typically applies a layer of resist to a substrate and develops the exposed resist) and/or a metrology unit. Where applicable, aspects disclosed herein can be applied to such and other substrate processing tools. Furthermore, a substrate can be processed more than once, for example in order to create a multi-layer IC, so that the term substrate used herein can also refer to a substrate that already contains multiple processed layers.

Furthermore, although some aspects of the present disclosure are described in the context of optical lithography, it should be understood that aspects of the present disclosure are not limited to optical lithography. For example, in imprint lithography, a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. The foregoing description of specific aspects will so fully reveal the general nature of the present disclosure that others can, by applying knowledge within the skill of the art, readily modify and/or adapt for various applications such specific aspects, without undue experimentation and without departing from the general concept of the present disclosure. Therefore, such adaptations and modifications are intended to be within the meaning and range of equivalents of the disclosed aspects, based on the teaching and guidance presented herein.

It is to be understood that the Detailed Description section, and not the Summary and Abstract sections, is intended to be used to interpret the claims. The Summary and Abstract sections can set forth one or more, but not necessarily all, aspects of the present disclosure as contemplated by the inventor(s), and thus, are not intended to limit the present disclosure and the appended claims in any way.

The breadth and scope of the protected subject matter should not be limited by any of the above-described aspects, but should be defined in accordance with the following claims and their equivalents.

The invention claimed is:

1. An inspection system comprising:

a radiation source configured to generate radiation to irradiate a target;

an integrated optical system comprising:

a substrate;

first, second, third, and fourth waveguides disposed on the substrate;

first and second grating couplers disposed on the substrate, wherein the first grating coupler is configured to couple first and third portions of radiation scattered by the target respectively into the first and third waveguides, and the second grating coupler is configured to couple second and fourth portions of radiation scattered by the target respectively into the second and fourth waveguides;

a first combiner coupled to the first and second waveguides, disposed on the substrate, and configured to combine the first and second portions of radiation; and a second combiner coupled to the third and fourth waveguides, disposed on the substrate and configured to combine the third and fourth portions of radiation;

a first detector configured to receive the combined first and second portions of radiation from the first combiner and to generate a first measurement signal based on the combined first and second portions of radiation; and a second detector configured to receive the combined third and fourth portions of radiation from the second combiner and to generate a second measurement signal based on the combined third and fourth portions of radiation.

2. The inspection system of claim 1, further comprising a processor configured to:

analyze the first and second measurement signals; and determine a position of the target based on the analyzing of the first measurement signal and a correction value for the position based on the analyzing of the second measurement signal.

3. The inspection system of claim 2, wherein the correction value corresponds to a tilt, defocus, or a layer stack profile of the target.

4. The inspection system of claim 1, wherein the first and second detectors are disposed on the substrate.

5. The inspection system of claim 1, wherein:

the integrated optical system further comprises fifth and sixth waveguides disposed on the substrate;

the first grating coupler is configured to couple fifth and sixth portions of radiation scattered by the target respectively into the fifth and sixth waveguides;

the integrated optical system further comprises a third combiner coupled to the fifth and sixth waveguides, disposed on the substrate, and configured to combine the fifth and sixth portions of radiation; and the inspection system further comprises a third detector configured to receive the combined fifth and sixth portions of radiation from the third combiner and to generate a third measurement signal based on the combined fifth and sixth portions of radiation.

6. The inspection system of claim 5, further comprising a processor configured to:

analyze the first, second, and third measurement signals; and determine a position of the target based on the analyzing of the first measurement signal, a first correction value for the position based on the analyzing of the second measurement signal, and a second correction value for the position based on the analyzing of the third measurement signal.

7. The inspection system of claim 6, wherein:

the first correction value corresponds to one of a tilt, defocus, or a layer stack profile of the target; and the second correction value corresponds to a different one of the tilt, defocus, or a layer stack profile of the target.

8. The inspection system of claim 1, wherein:

the integrated optical system further comprises:

fifth and sixth waveguides disposed on the substrate;

a third grating coupler disposed on the substrate and configured to couple fifth and sixth portions of radiation scattered by the target respectively into the fifth and sixth waveguides; and a third combiner coupled to the fifth and sixth waveguides, disposed on the substrate, and configured to combine the fifth and sixth portions of radiation; and the inspection system further comprises a third detector configured to receive the combined fifth and sixth portions of radiation from the third combiner and to generate a third measurement signal based on the combined fifth and sixth portions of radiation.

9. The inspection system of claim 8, further comprising a processor configured to:

analyze at least the third measurement signals; and determine a defocus of the target based on the analyzing of the third measurement signal.

10. The inspection system of claim 1, wherein:

the first grating coupler is further configured to perform the coupling of the first and third portions of radiation such that the first and third portions of radiation have approximately equal intensity; and the second grating coupler is further configured to perform the coupling of the second and fourth portions of radiation such that the second and fourth portions of radiation have approximately equal intensity.

11. A lithographic apparatus comprising:

an illumination system configured to illuminate a pattern of a patterning device;

a projection system configured to project an image of the pattern onto a wafer; and an inspection system comprising:

a radiation source configured to generate radiation to irradiate a target;

an integrated optical system comprising:

a substrate;

first, second, third, and fourth waveguides disposed on the substrate;

first and second grating couplers disposed on the substrate, wherein the first grating coupler is configured to couple first and third portions of radiation scattered by the target respectively into the first and third waveguides, and the second grating coupler is configured to couple second and fourth portions of radiation scattered by the target respectively into the second and fourth waveguides;

a first combiner coupled to the first and second waveguides, disposed on the substrate, and configured to combine the first and second portions of radiation; and a second combiner coupled to the third and fourth waveguides, disposed on the substrate and configured to combine the third and fourth portions of radiation;

a first detector configured to receive the combined first and second portions of radiation from the first combiner and to generate a first measurement signal based on the combined first and second portions of radiation; and a second detector configured to receive the combined third and fourth portions of radiation from the second combiner and to generate a second measurement signal based on the combined third and fourth portions of radiation.

12. The lithographic apparatus of claim 11, further comprising a processor configured to:

analyze the first and second measurement signals; and determine a position of the target based on the analyzing of the first measurement signal and a correction value for the position based on the analyzing of the second measurement signal.

13. The lithographic apparatus of claim 12, wherein the correction value corresponds to a tilt, defocus, or a layer stack profile of the target.

14. The lithographic apparatus of claim 11, wherein the first and second detectors are disposed on the substrate.

15. The lithographic apparatus of claim 11, wherein:

the integrated optical system further comprises fifth and sixth waveguides disposed on the substrate;

the first grating coupler is configured to couple fifth and sixth portions of radiation scattered by the target respectively into the fifth and sixth waveguides;

the integrated optical system further comprises a third combiner coupled to the fifth and sixth waveguides, disposed on the substrate, and configured to combine the fifth and sixth portions of radiation; and the inspection system further comprises a third detector configured to receive the combined fifth and sixth portions of radiation from the third combiner and to generate a third measurement signal based on the combined first and second portions of radiation.

* * * * *